(12) United States Patent
Takizawa

(10) Patent No.: US 11,320,451 B2
(45) Date of Patent: May 3, 2022

(54) ACCELERATION SENSOR, ELECTRONIC DEVICE, AND VEHICLE

(71) Applicant: SEIKO EPSON CORPORATION, Tokyo (JP)

(72) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 150 days.

(21) Appl. No.: 16/694,544

(22) Filed: Nov. 25, 2019

(65) Prior Publication Data

US 2020/0166536 A1 May 28, 2020

(30) Foreign Application Priority Data

Nov. 28, 2018 (JP) .............................. JP2018-222816

(51) Int. Cl.
*G01C 19/5705* (2012.01)
*G01P 15/08* (2006.01)
*G01C 19/5733* (2012.01)

(52) U.S. Cl.
CPC ...... *G01P 15/0802* (2013.01); *G01C 19/5705* (2013.01); *G01C 19/5733* (2013.01); *B81B 2201/0235* (2013.01)

(58) Field of Classification Search
CPC .................................................. G01P 15/0802
USPC ......................................................... 73/1.38
See application file for complete search history.

(56) References Cited

U.S. PATENT DOCUMENTS

| | | | |
|---|---|---|---|
| 2011/0031959 A1* | 2/2011 | Konno | G01P 15/18 324/162 |
| 2012/0210789 A1 | 8/2012 | Kanemoto et al. | |
| 2016/0041198 A1 | 2/2016 | Tanaka et al. | |
| 2019/0257854 A1* | 8/2019 | Challener | G01P 15/097 |

FOREIGN PATENT DOCUMENTS

| | | |
|---|---|---|
| JP | 2014188669 | 10/2014 |
| JP | 2015031645 | 2/2015 |
| JP | 2016040550 | 3/2016 |

* cited by examiner

*Primary Examiner* — Walter L Lindsay, Jr.
*Assistant Examiner* — Philipmarcus T Fadul
(74) *Attorney, Agent, or Firm* — Workman Nydegger

(57) ABSTRACT

An acceleration sensor includes a substrate, a first movable body that includes a first movable portion and a second movable portion having a rotational moment around a first swinging axis smaller than that of the first movable portion, a second movable body that includes a third movable portion and a fourth movable portion having a rotational moment around a second swinging axis smaller than that of the third movable portion, a first fixed electrode that is disposed on the substrate and faces the first movable portion, a second fixed electrode that faces the second movable portion, a third fixed electrode that faces the third movable portion, a fourth fixed electrode that faces the fourth movable portion, and a coupling portion that couples the first movable body and the second movable body.

12 Claims, 17 Drawing Sheets

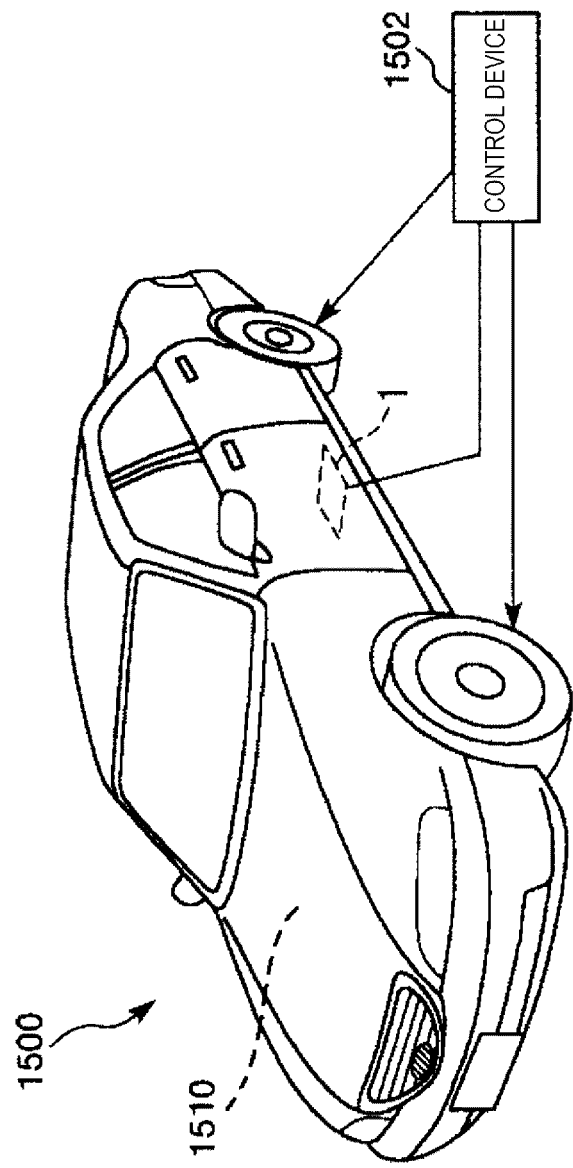

ACCELERATION SENSOR, ELECTRONIC DEVICE, AND VEHICLE

The present application is based on, and claims priority from JP Application Serial Number 2018-222816, filed Nov. 28, 2018, the disclosure of which is hereby incorporated by reference herein in its entirety.

BACKGROUND

1. Technical Field

The present disclosure relates to an acceleration sensor, an electronic device, and a vehicle.

2. Related Art

For example, an acceleration sensor described in JP-A-2015-31645 is a sensor capable of measuring acceleration in the Z-axis direction, and includes a substrate, a pair of movable portions that swing in a seesaw manner around a swinging axis along the Y-axis direction with respect to the substrate, and fixed electrodes provided on the substrate. Each movable portion includes a first movable portion and second movable portion that are provided with a swinging axis interposed therebetween and have different rotational moments around the swinging axis. The fixed electrodes include a pair of first fixed electrodes disposed on the substrate to face the first movable portion of each movable portion and a pair of second fixed electrodes disposed on the substrate to face the second movable portion of each movable portion.

In the acceleration sensor having such a configuration, when acceleration in the Z-axis direction is applied, each movable portion swings in a seesaw manner around the swinging axis due to a difference in a rotational moment, so that capacitance between each first movable portion and each first fixed electrode and capacitance between each second movable portion and each second fixed electrode are displaced in opposite phases. For that reason, the acceleration in the Z-axis direction can be measured based on an amount of change (differential) in capacitance. In particular, in the acceleration sensor of JP-A-2015-31645, by providing the pair of movable portions, sensitivity of other axes, that is, sensitivity of acceleration in the X-axis and Y-axis directions, which are axes other than a detection axis, is suppressed, and detection accuracy is improved.

However, due to manufacturing variations, variations in frequency characteristics may occur between the pair of movable portions. As such, when the frequency characteristics vary between the pair of movable portions, there is a problem that variations in brown noise characteristics occur between the pair of movable portions and noise characteristics deteriorate.

SUMMARY

An acceleration sensor according to an aspect of the present disclosure includes a substrate, a first movable body that includes a first movable portion and a second movable portion having a rotational moment around a first swinging axis smaller than that of the first movable portion, the first movable portion and second movable portion being disposed with the first swinging axis interposed therebetween, and swings around the first swinging axis with respect to the substrate, a second movable body that includes a third movable portion and a fourth movable portion having a rotational moment around a second swinging axis smaller than that of the third movable portion, the third movable portion and fourth movable portion being disposed with the second swinging axis interposed therebetween, and swings around the second swinging axis with respect to the substrate, a first fixed electrode that is disposed on the substrate and faces the first movable portion, a second fixed electrode that is disposed on the substrate and faces the second movable portion, a third fixed electrode that is disposed on the substrate and faces the third movable portion, a fourth fixed electrode that is on the substrate and faces the fourth movable portion, and a coupling portion that couples the first movable body and the second movable body.

BRIEF DESCRIPTION OF THE DRAWINGS

FIG. 17 is a perspective view illustrating a vehicle according to an eleventh embodiment of the present disclosure.

DESCRIPTION OF EXEMPLARY EMBODIMENTS

Hereinafter, an acceleration sensor, an electronic device, and a vehicle according to the present disclosure will be described in detail based on embodiments illustrated in the accompanying drawings.

First Embodiment

Figure 1:
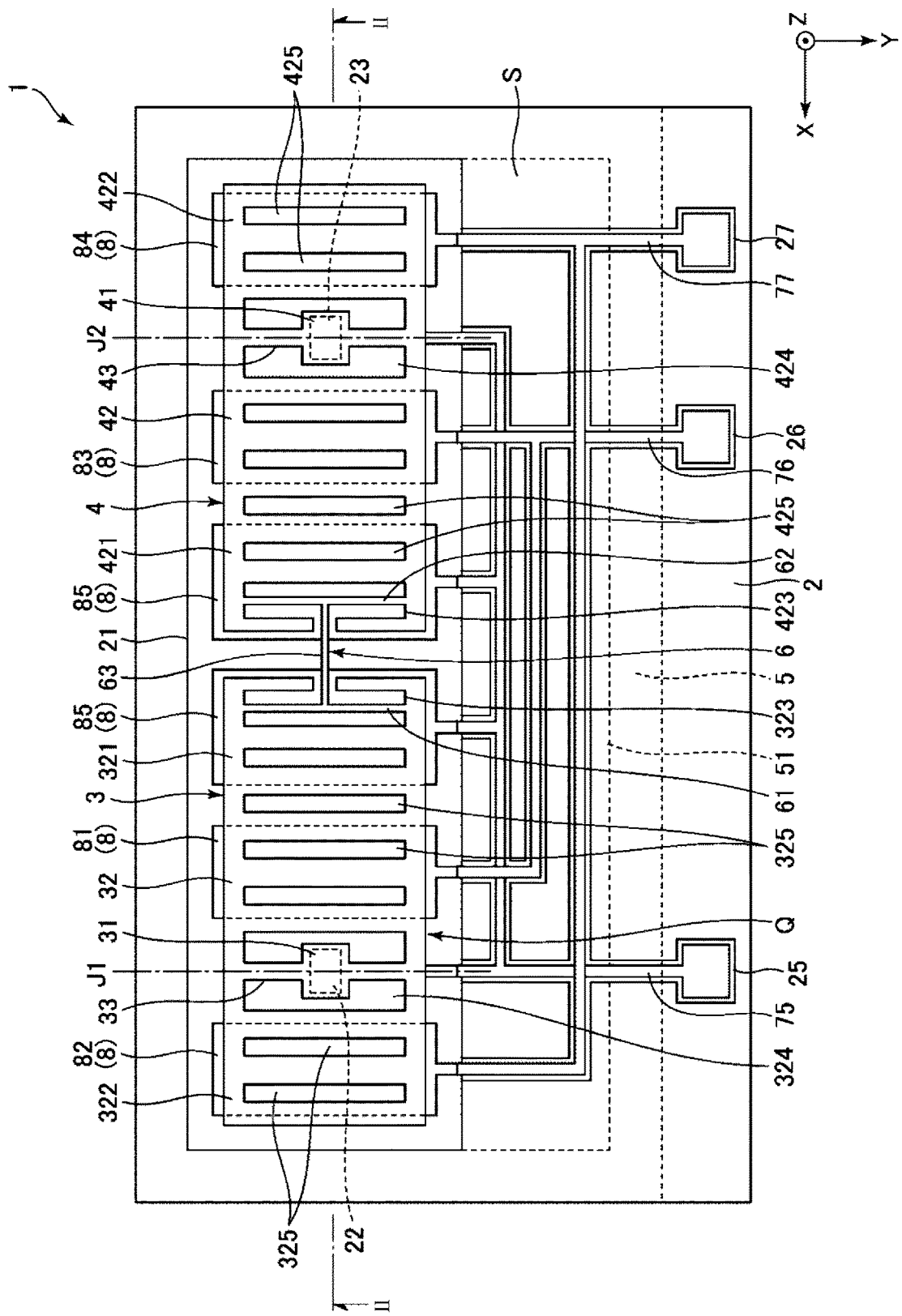
FIG. 1 is a plan view illustrating an acceleration sensor according to a first embodiment of the present disclosure.

FIG. 1 is a plan view illustrating an acceleration sensor according to a first embodiment of the present disclosure.

Figure 2:
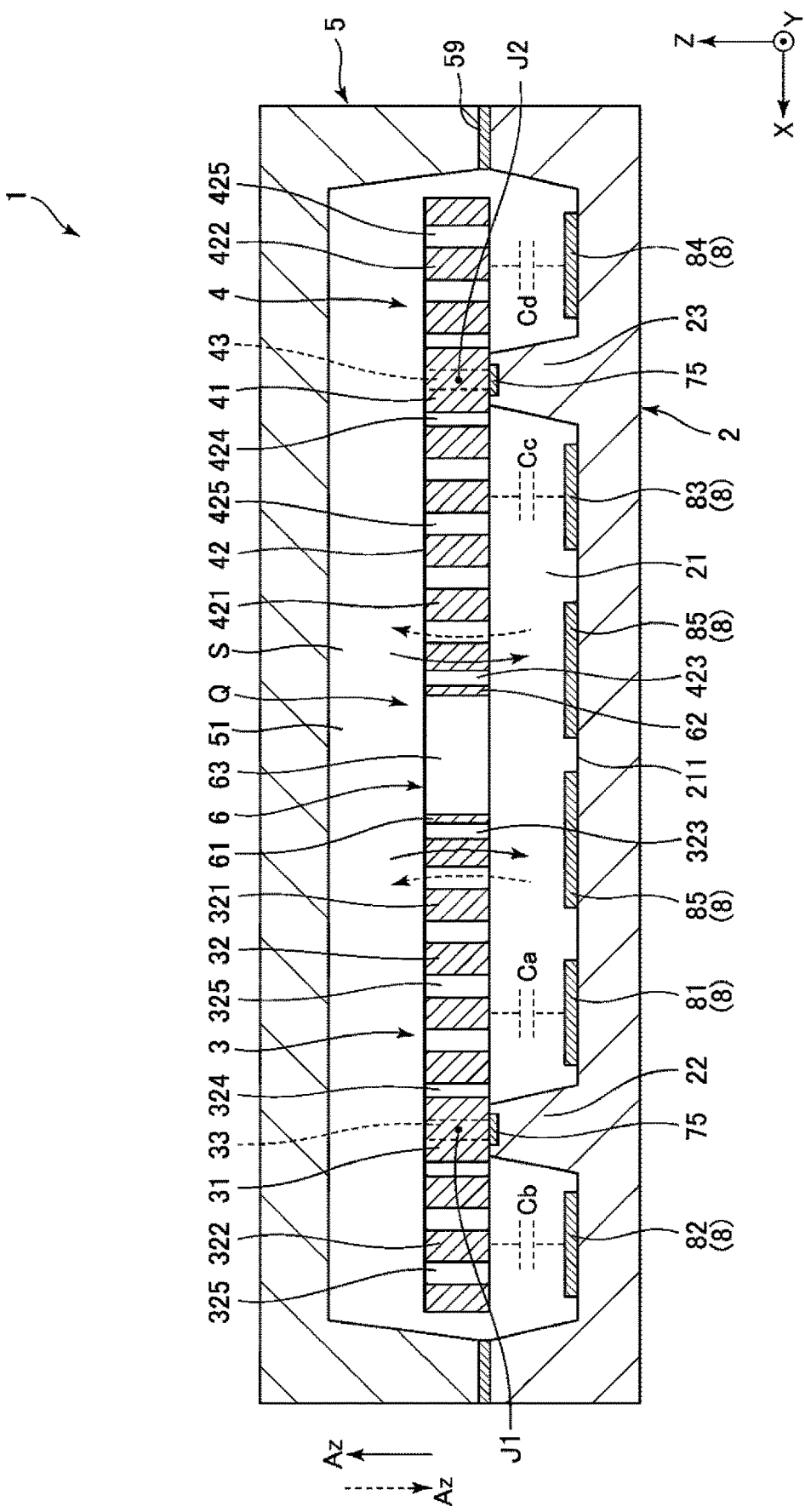
FIG. 2 is a cross-sectional view taken along line II-II in FIG. 1.
Figure 3:
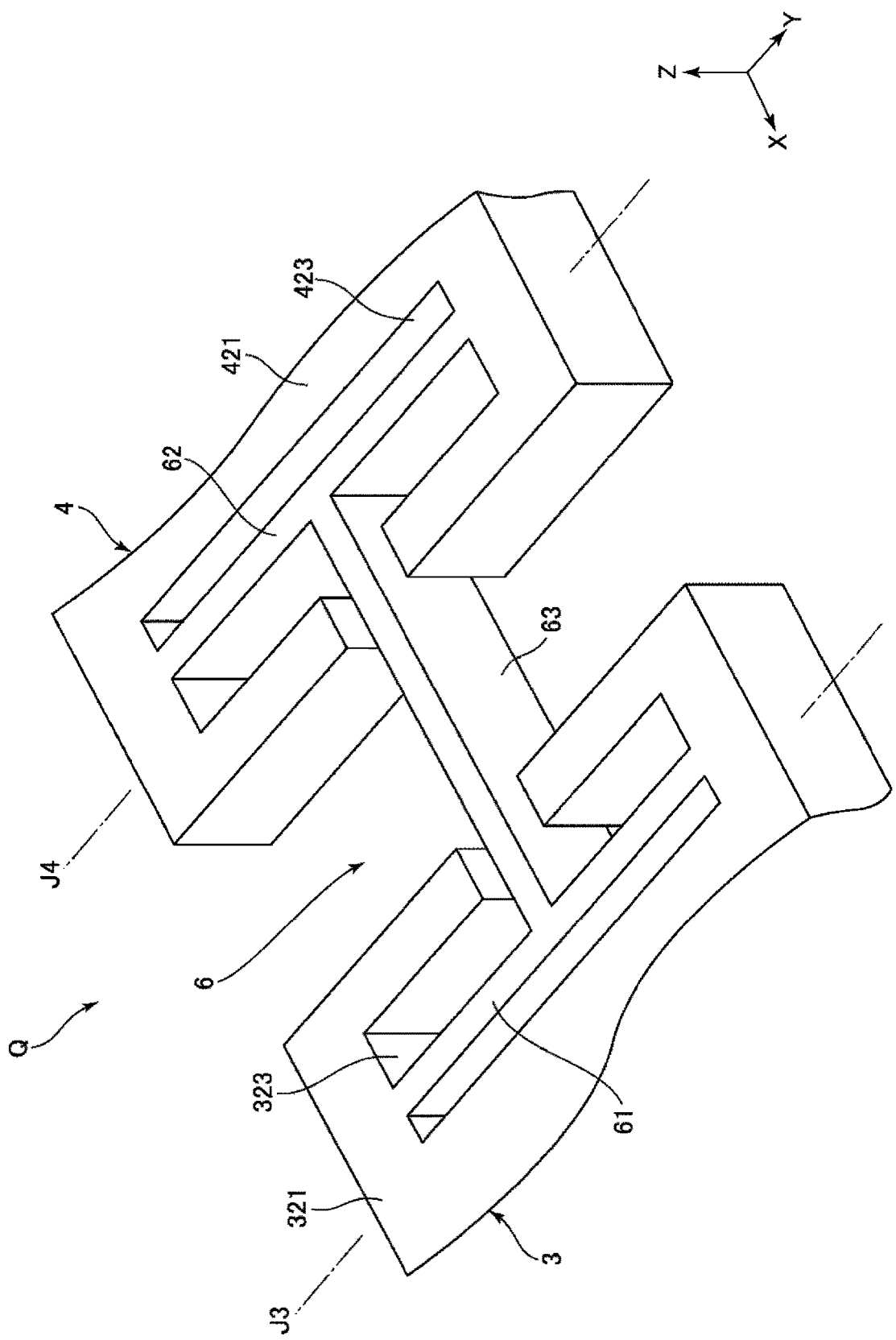
FIG. 3 is a perspective view illustrating a coupling portion included in the acceleration sensor of FIG. 1.
Figure 4:
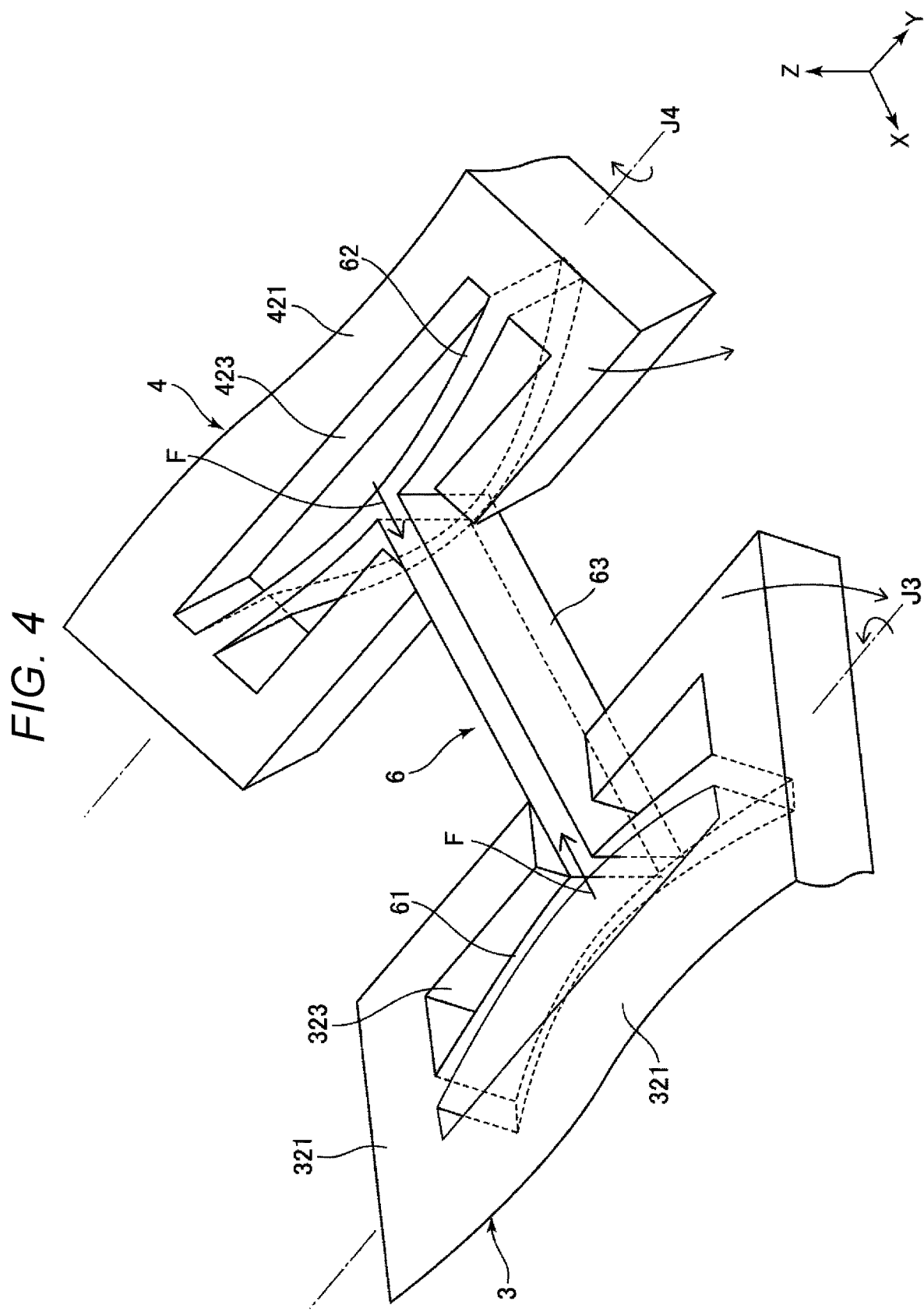
FIG. 4 is a perspective view illustrating a state in which the coupling portion of FIG. 3 is deformed.

FIG. 2 is a cross-sectional view taken along line II-II in FIG. 1. FIG. 3 is a perspective view illustrating a coupling portion included in the acceleration sensor of FIG. 1. FIG. 4 is a perspective view illustrating a state in which the coupling portion of FIG. 3 is deformed.

In the following, for convenience of explanation, the X-axis, Y-axis, and Z-axis are illustrated as three axes orthogonal to each other, and a direction parallel to the X-axis is referred to as an "X-axis direction", a direction parallel to the Y-axis is referred as a "Y-axis direction", and a direction parallel to the Z-axis is referred as a "Z-axis direction". A tip end side of the arrow of each axis is also referred to as a "plus side", and the opposite side is also referred to a "minus side". The plus side in the Z-axis direction is also referred to as "upper", and the minus side in the Z-axis direction is also referred to as "lower". In the specification of the present application, the term "orthogonal to" includes not only a case where constituent elements intersect at 90° but also a case where the constituent elements intersect at an angle slightly inclined from 90°, for example, within a range of 90°±5°. Similarly, the term "parallel to" also includes the case where the difference between two constituent elements is in the range of about ±5°, as well as in the case of an angle of 0°.

An acceleration sensor 1 illustrated in FIG. 1 is a sensor that detects acceleration Az in the Z-axis direction. Such an acceleration sensor 1 includes a substrate 2, a first element 3 and a second element 4 disposed on the substrate 2, a coupling portion 6 for coupling the first element 3 and the second element 4, and a lid 5 bonded to the substrate 2 to cover the first and second elements 3 and 4.

As illustrated in FIG. 1, the substrate 2 has a concave portion 21 which opens to the upper surface side. The concave portion 21 is formed larger than the first and second elements 3 and 4 so as to enclose the first and second elements 3 and 4 inside in plan view in the Z-axis direction. As illustrated in FIG. 2, the substrate 2 includes a projection-shaped first mount 22 and second mount 23 which are provided to protrude from a bottom surface 211 of the concave portion 21. The first element 3 is bonded to the upper surface of the first mount 22 and the second element 4 is bonded to the upper surface of the second mount 23. As illustrated in FIG. 1, the substrate 2 has groove portions 25, 26 and 27 which open to the upper surface side.

As such a substrate 2, for example, a glass substrate made of a glass material containing alkali metal ions that are movable ions such as Nat, for example, borosilicate glass such as Pyrex glass and Tempax glass (both are registered trademarks) can be used. However, the substrate 2 is not particularly limited, and for example, a silicon substrate or a ceramic substrate may be used.

Also, as illustrated in FIG. 1, the substrate 2 is provided with an electrode 8. The electrode 8 includes a first fixed electrode 81, a second fixed electrode 82, a third fixed electrode 83, a fourth fixed electrode 84, and a dummy electrode 85 that are disposed on the bottom surface 211 of the concave portion 21. The substrate 2 includes wirings 75, 76, and 77 respectively disposed in the grooves 25, 26, and 27.

One end of each of the wirings 75, 76, and 77 is exposed to the outside of the lid 5 and functions as an electrode pad for electrically coupling to an external apparatus. The wiring 75 is electrically coupled to the first element 3, the second element 4, and the dummy electrode 85, the wiring 76 is electrically coupled to the first fixed electrode 81 and the third fixed electrode 83, and the wiring 77 is electrically coupled to the second fixed electrode 82 and the fourth fixed electrode 84. Although not illustrated, intersections of the wirings 75, 76, and 77 are subjected to insulation processing so that short circuiting therebetween is prevented.

As illustrated in FIG. 2, the lid 5 has a concave portion 51 which opens to the lower surface side. The lid 5 is bonded to the upper surface of the substrate 2 so as to accommodate the first and second elements 3 and 4 in the concave portion 51. An accommodation space S in which the first and second elements 3 and 4 are accommodated is formed by the lid 5 and the substrate 2. The accommodation space S is an air-tight space, may be filled with an inert gas such as nitrogen, helium, and argon, and is at almost atmospheric pressure at the operating temperature (about −40° C. to 120° C.). However, the atmosphere of the accommodation space S is not particularly limited, and may be, for example, a reduced pressure state or a pressurized state.

As the lid 5, for example, a silicon substrate can be used. However, the lid 5 is not particularly limited, and for example, a glass substrate or a ceramic substrate may be used. The bonding method between the substrate 2 and the lid is not particularly limited, and may be appropriately selected depending on the materials of the substrate 2 and the lids. For example, anodic bonding, active bonding for bonding the bonding surfaces activated by plasma irradiation, bonding with a bonding material such as glass frit, diffusion bonding for bonding the metal films formed on the upper surface of the substrate 2 and the lower surface of the lid 5, and the like may be included. In the first embodiment, the substrate 2 and the lid 5 are bonded via a glass frit 59 made of low melting point glass.

As illustrated in FIG. 1, the first element 3, the second element 4, and the coupling portion 6 are integrally formed. These components are formed by patterning a conductive silicon substrate doped with, for example, impurities such as phosphorus (P), boron (B), arsenic (As) or the like by etching, particularly by dry etching.

The first element 3 includes a fixed portion 31 subjected to anodic bonding to the upper surface of the first mount 22, a first movable body 32 displaceable with respect to the fixed portion 31, and a beam 33 coupling the fixed portion 31 and the first movable body 32. However, the bonding method of the first mount 22 and the fixed portion 31 is not limited to anodic bonding.

When acceleration Az acts on the first element 3, the first movable body 32 swings in a seesaw manner with respect to the substrate 2 while torsionally deforming the beam 33 around a first swinging axis J1 formed by the beam 33. That is, the first movable body 32 and the beam 33 swing in opposite directions around the first swinging axis J1. The first swinging axis J1 of the first embodiment is formed along the Y-axis direction.

The first movable body 32 has a rectangular shape whose major axis is the X-axis direction in plan view in the Z-axis direction. The first movable body 32 includes a first movable portion 321 and a second movable portion 322 which are disposed with the first swinging axis J1 interposed therebetween in plan view in the Z-axis direction. The first movable portion 321 is positioned on the minus side in the X-axis direction with respect to the first swinging axis J1, and the second movable portion 322 is positioned on the plus side in the X-axis direction with respect to the first swinging axis J1. The first movable portion 321 is longer in the X-axis direction than the second movable portion 322, and the rotational moment around the first swinging axis J1 when the acceleration Az is applied is larger than that of the second movable portion 322. Due to the difference in the rotational moment, the first movable body 32 swings in a seesaw manner around the first swinging axis J1 when the acceleration Az is applied. Here, swinging in a seesaw manner means that swinging is performed in such away that when the first movable portion 321 is displaced to the plus side in the Z-axis direction, the second movable portion 322 is displaced to the minus side in the Z-axis direction, and on the contrary, when the first movable portion 321 is displaced to the minus side in the Z-axis direction, the second movable portion 322 is displaced to the plus side in the Z-axis direction.

The first movable body 32 also has a plurality of through-holes 325 penetrating in the thickness direction. The first movable body 32 has an opening 324 positioned between the first movable portion 321 and the second movable portion 322. The fixed portion 31 and the beam 33 are disposed in the opening 324. However, the through-holes 325 may be omitted. The through-holes 325, the opening 324, and the like should be designed appropriately in accordance with a damping phenomenon of inert gas sealed in the airtight space. A Q value (Q-Factor) of vibration of a coupling structure of the first element 3 and the second element 4 including the coupling portion 6 can be changed by the shape of the through-holes 325 and the opening 324, the pressure of the inert gas, and the like. The disposition of the fixed portion 31 and the beam 33 is not particularly limited, and may be positioned outside the first movable body 32, for example.

The second element 4 has the same configuration as the first element 3, that is, the same size and shape. The second element 4 is disposed side by side with the first element 3 in the X-axis direction, and is positioned on the minus side of the first element 3 in the X-axis direction, in the first embodiment. The second element 4 is disposed so as to be line-symmetric to the first element 3 with respect to a bisector of a connection beam 63 (described later) which is parallel to the Y-axis, that is, to be a mirror image relationship.

The second element 4 includes a fixed portion 41 subjected to anodic bonding to the upper surface of the second mount 23, a second movable body 42 displaceable with respect to the fixed portion 41, and a beam 43 coupling the fixed portion 41 and the second movable body 42. However, the bonding method of the second mount 23 and the fixed portion 41 is not limited to anodic bonding.

When acceleration Az acts on the second element 4, the second movable body 42 swings in a seesaw manner with respect to the substrate 2 while torsionally deforming the beam 43 around a second swinging axis J2 formed by the beam 43. The second swinging axis J2 of the first embodiment is formed along the Y-axis direction. That is, the second swinging axis J2 is parallel to the first swinging axis J1.

The second movable body 42 has a rectangular shape whose major axis is the X-axis direction in plan view in the Z-axis direction. The second movable body 42 includes a third movable portion 421 and a fourth movable portion 422 which are disposed with the second swinging axis J2 interposed therebetween in plan view in the Z-axis direction. The third movable portion 421 is positioned on the plus side in the X-axis direction with respect to the second swinging axis J2, and the fourth movable portion 422 is positioned on the minus side in the X-axis direction with respect to the second swinging axis J2. The third movable portion 421 is longer in the X-axis direction than the fourth movable portion 422, and the rotational moment around the second swinging axis J2 when the acceleration Az is applied is larger than that of the fourth movable portion 422. Due to the difference in the rotational moment, the second movable body 42 swings in a seesaw manner around the second swinging axis J2 when acceleration Az is applied.

The second movable body 42 also has a plurality of through-holes 425 penetrating in the thickness direction. The second movable body 42 has an opening 424 positioned between the third movable portion 421 and the fourth movable portion 422. The fixed portion 41 and the beam 43 are disposed in the opening 424. However, the through-holes 425 may be omitted. The disposition of the fixed portion 41 and the beam 43 is not particularly limited, and may be positioned outside the second movable body 42, for example.

The first element 3 and the second element 4 are disposed side by side in the X-axis direction orthogonal to the first and second swinging axes J1 and J2, and the first movable portion 321 of the first element 3 and the third movable portion 421 of the second element 4 are disposed to face each other. That is, the first element 3 is disposed with the first movable portion 321 on the second element 4 side, and the second element 4 is disposed with the third movable portion 421 on the first element 3 side.

Returning to the description of the electrode 8 disposed on the bottom surface 211, as illustrated in FIGS. 1 and 2, the first fixed electrode 81 is disposed to face a base end of the first movable portion 321, the second fixed electrode 82 is disposed to face the second movable portion 322, the third fixed electrode 83 is disposed to face a base end of the third movable portion 421, the fourth fixed electrode 84 is disposed to face the fourth movable portion 422, and the dummy electrode 85 is disposed to face the tip end of the first movable portion 321 and the tip end of the third movable portion 421. In other words, in plan view in the Z-axis direction, the first fixed electrode 81 is disposed to overlap the base end of the first movable portion 321, the second fixed electrode 82 is disposed to overlap the second movable portion 322, the third fixed electrode 83 is disposed to overlap the base end of the third movable portion 421, the fourth fixed electrode 84 is disposed to overlap the fourth movable portion 422, and the dummy electrode 85 is disposed to overlap the tip end of the first movable portion 321 and the tip end of the third movable portion 421.

When the acceleration sensor 1 is driven, a driving voltage is applied to the first element 3 and the second element 4 through the wiring 75, the first fixed electrode 81 and the third fixed electrode 83 are coupled to a QV amplifier via the wiring 76, and the second fixed electrode 82 and the fourth fixed electrode 84 are coupled to another QV amplifier via the wiring 77. With this configuration, capacitance Ca is formed between the first movable portion 321 and the first fixed electrode 81, capacitance Cb is formed between the second movable portion 322 and the second fixed electrode 82, capacitance Cc is formed between the third movable portion 421 and the third fixed electrode 83, and capacitance Cd is formed between the fourth movable portion 422 and the fourth fixed electrode 84.

As illustrated in FIG. 2, when the acceleration Az is applied to the acceleration sensor 1, the first movable body 32 swings in a seesaw manner around the first swinging axis J1, and the second movable body 42 swings in a seesaw manner around the second swinging axis J2. By such seesaw swinging of the first and second movable bodies 32 and 42, gaps between the first movable portion 321 and the first fixed electrode 81 and between the third movable portion 421 and the third fixed electrode 83 and gaps between the second movable portion 322 and the second fixed electrode 82 and between the fourth movable portion 422 and the fourth fixed electrode 84 change in opposite phases to each other, and in response to this, the capacitances Ca and Cc and the capacitances Cb and Cd change in opposite phases to each other. For that reason, the acceleration sensor 1 can measure the acceleration Az based on the difference (change amount) between the capacitances Ca and Cc and the capacitances Cb and Cd.

In particular, since the first element 3 and the second element 4 are provided, for example, compared to the case of being configured by either one of the first element 3 and the second element 4, sensitivity of the other axes, that is, sensitivity of the acceleration in the X-axis and Y-axis directions other than the Z-axis that is the detection axis can be suppressed, and detection accuracy can be improved.

Here, as described above, since the first element 3 and the second element 4 have the same configuration, the elements have the same frequency characteristics in design. However, due to manufacturing variations, it is difficult to make the shapes of the first element 3 and the second element 4 completely coincide with each other, and this may cause a shift in the frequency characteristics of the first element 3 and the second element 4. As such, when the frequency characteristics of the first element 3 and the second element 4 are shifted, noise characteristics, particularly brown noise characteristics, which are important characteristics of the acceleration sensor, greatly vary. This is because brown noise is synthesized using the mean square of noise using two different elements as noise sources. Accordingly, an acceleration sensor with the manufacturing variation leads to deterioration of the noise characteristics, and a ratio (S/N ratio) between the detection sensitivity and the noise output of the acceleration sensor is reduced.

Therefore, in the acceleration sensor 1, the first element 3 and the second element 4 are coupled using the coupling portion 6, the frequency characteristics of the first element 3 and the second element 4 are aligned to suppress the deterioration of noise characteristics described above, by making the first element 3 and the second element 4 into one structural body Q. However, as will be described later, a spring constant of the coupling portion 6 is appropriately adjusted. With this configuration, the acceleration sensor 1 having a high S/N ratio can be obtained without being influenced by manufacturing variations. Manufacturing cost can be reduced and the yield can be improved as much as the influence of manufacturing variations is reduced.

Hereinafter, the coupling portion 6 will be described. As described above, the coupling portion 6 is integrally formed with the first and second elements 3 and 4 and is made of a silicon material. The silicon material is single crystal silicon, polycrystalline silicon, amorphous silicon or the like. Such a material is excellent as an elastic body, and is also suitable for mechanical durability. For that reason, formation of the coupling portion 6 becomes easy. For example, compared to the case where the coupling portion 6 is formed separately from the first element 3 and the second element 4, mechanical strength of the structural body Q can be increased from the point that a bonded portion between the first element 3 and the second element 4 does not occur. However, the coupling portion 6 may be formed separately from the first element 3 and the second element 4.

As illustrated in FIG. 3, the coupling portion 6 is disposed between the first element 3 and the second element 4, and couples the first movable portion 321 of the first element 3 and the third movable portion 421 of the second element 4. As described above, the first element 3 is disposed with the first movable portion 321 facing the second element 4, and the second element 4 is disposed with the third movable portion 421 facing the first element 3 side. For that reason, the first movable portion 321 and the third movable portion 421 are disposed to face each other, and the coupling portion is positioned between the first and third portions. Accordingly, the coupling portion 6 makes it easy to couple the first movable portion 321 and the third movable portion 421, and the configuration of the coupling portion 6 is simplified.

Such a coupling portion 6 includes a first beam 61 coupled to the first movable portion 321, a second beam 62 coupled to the third movable portion 421, and a connecting beam 63 coupling the first beam 61 and the second beam 62.

A cutout 323 is formed at the tip end of the first movable portion 321, and the first beam 61 is disposed in the cutout 323. The first beam 61 linearly extends along the Y-axis direction, and is coupled to the first movable portion 321 at both ends thereof. Similarly, a cutout 423 is formed at the tip end of the third movable portion 421, and the second beam 62 is disposed in the cutout 423. The second beam 62 linearly extends along the Y-axis direction, and is coupled to the third movable portion 421 at both ends thereof. Further, the connecting beam 63 linearly extends along the X-axis direction, and the plus side end in the X-axis direction thereof is coupled to the central portion of the first beam 61 in the length direction, and the minus side end in the X-axis direction thereof is coupled to the central portion of the second beam 62 in the length direction.

As illustrated in FIG. 4, in the coupling portion 6 having such a configuration, the first and second beams 61 and 62 are bent and deformed in the X-axis direction while being torsionally deformed around the central axes J3 and J4 and accordingly, seesaw swinging of the first and second movable bodies 32 and 42 around the first and second swinging axes J1 and J2 is allowed. On the other hand, the first and second beams 61 and 62 have a long shape in the Y-axis direction, and the coupling portion 6 has a structure that is difficult to bend in the Y-axis direction as a whole. With this configuration, deterioration of the noise characteristic can be suppressed without hindering measurement of the acceleration Az. The first beam 61 and the second beam 62 are sufficiently soft with respect to the beams 33 and 43 so that the first and second movable bodies 32 and 42 can be allowed to swing sufficiently around the first and second swinging axes J1 and J2, respectively. For example, when the torsion spring constant of the first and second beams 61 and 62 is A and the torsion spring constant of the beams 33 and 43 is B, A/B≤0.1 is preferable, and A/B≤0.05 is more preferable. More specifically, when the torsion springs of the first and second beams 61 and 62 and the torsion springs of the beams 33 and 43 are designed to have the same length for the sake of simplicity, the torsion spring constant is proportional to the cube of a spring width. When the torsion spring width of the first and second beams 61 and 62 is 5 µm, if the width of the torsion spring of the beams 33 and 43 is 1.8 µm or less, a ratio A/B of the spring constant described above can be set to 0.05 or less. In this manner, it is possible to suppress the deterioration of the noise characteristics while sufficiently securing the easiness of swinging of the first and second movable bodies 32 and 42.

The coupling portion 6 also has a function of suppressing sticking of the first movable body 32 and the second movable body 42 to the substrate 2. Here, sticking means that, for example, due to the electrostatic attraction generated between the first movable body 32 and the first fixed electrode 81 and the electrostatic attraction generated between the second movable body 42 and the third fixed electrode 83, the first and second movable bodies 32 and 42 are drawn to the substrate 2 side and the first and second movable bodies 32 and 42 remain in contact with the substrate 2.

As described above, the coupling portion 6 includes the first and second beams 61 and 62 that are bent and deformed in the X-axis direction along with the seesaw swinging of the first and second movable bodies 32 and 42 around the first and second swinging axes J1 and J2. When the first and second movable bodies 32 and 42 are swung around the first and second swinging axes J1 and J2 by such bending deformation of the first and second beams 61 and 62, a force F is generated in a direction that causes the first and second movable bodies 32 and 42 to approach each other. By allowing the force F to counter the electrostatic attractive force between the first and second movable bodies 32 and 42 and the substrate 2, sticking of the first movable body 32 and the second movable body 42 to the substrate 2 is effectively suppressed.

The acceleration sensor 1 has been described as above. Such an acceleration sensor 1 includes the substrate 2, the first movable body 32 that includes the first movable portion 321 and the second movable portion 322 having a rotational moment around the first swinging axis J1 smaller than that of the first movable portion 321, the first movable portion 321 and second movable portion 322 being disposed with a first swinging axis interposed therebetween, and swings around the first swinging axis J1 with respect to the substrate 2, the second movable body 42 that includes the third movable portion 421 and the fourth movable portion 422 having a rotational moment around the second swinging axis J2 smaller than that of the third movable portion 421, the third movable portion 421 and fourth movable portion 422 being disposed with the second swinging axis J2 interposed therebetween, and swings around the second swinging axis J2 with respect to the substrate 2, the first fixed electrode 81 disposed on the substrate 2 and facing the first movable portion 321, the second fixed electrode 82 disposed on the substrate 2 and facing the second movable portion 322, the third fixed electrode 83 disposed on the substrate 2 and facing the third movable portion 421, the fourth fixed electrode 84 disposed on the substrate 2 and facing the fourth movable portion 422, and the coupling portion 6 that couples the first movable body 32 and the second movable body 42. As such, by providing the coupling portion 6 coupling the first movable body 32 and the second movable body 42, the first element 3 and the second element 4 can be made into one structure body Q, the frequency characteristics of the first element 3 and the second element 4 are aligned, and the deterioration of noise characteristics due to the variation in the frequency characteristics of the first element 3 and the second element 4 is suppressed. With this configuration, the acceleration sensor 1 having high detection sensitivity can be obtained without being influenced by manufacturing variations. Manufacturing cost can be reduced and the yield can be improved as much as the influence of manufacturing variations is reduced.

As described above, the coupling portion 6 couples the first movable portion 321 and the third movable portion 421. With this configuration, the first movable body 32 and the second movable body 42 can be easily coupled. Since the first movable portion 321 and the third movable portion 421 are swung in a seesaw manner in the same phase, the first movable portion 321 and the third movable portion 421 are coupled by the coupling portion 6, thereby capable of suppressing the deformation amount of the coupling portion 6 compared to the case where the first movable portion 321 and the fourth movable portion 422 that are swung in a seesaw manner in the opposite phases are coupled by the coupling portion 6, for example, as in a third embodiment to be described later. For that reason, breakage of the coupling portion 6 can be more effectively suppressed.

Also, as described above, the first swinging axis J1 and the second swinging axis J2 are parallel to each other, the first movable body 32 and the second movable body 42 are disposed side by side in the X-axis direction orthogonal to the first swinging axis J1 and the second swinging axis J2 in plan view of the substrate 2, and the first movable portion 321 and the third movable portion 421 face each other. In other words, the first movable portion 321 and the third movable portion 421 are provided between the first swinging axis J1 and the second swinging axis J2. With this configuration, by disposing the coupling portion 6 between the first movable portion 321 and the third movable portion 421, the first movable portion 321 and the third movable portion 421 are easily coupled by the coupling portion 6. Further, the configuration of the coupling portion 6 becomes simpler, and formation of the coupling portion 6 becomes easy.

As described above, the coupling portion 6 includes the first beam 61 connected to the first movable body 32 and torsionally deformed around a central axis J3 parallel to the first swinging axis J1, the second beam 62 connected to the second movable body 42 and torsionally deformed around a central axis J4 parallel to the second swinging axis J2, and a connecting beam 63 coupling the first beam 61 and the second beam 62. With this configuration, the structure of the coupling portion 6 becomes easy.

As described above, the first movable body 32, the second movable body 42, and the coupling portion 6 are integrally formed. With this configuration, formation of the first movable body 32, the second movable body 42, and coupling portion 6 becomes easy. For example, as compared to the case where the coupling portion 6 is formed separately from the first element 3 and the second element 4, the mechanical strength of the structural body Q can be increased from the point that a bonded portion between the first element 3 and the second element 4 does not occur.

Second Embodiment

Figure 5:
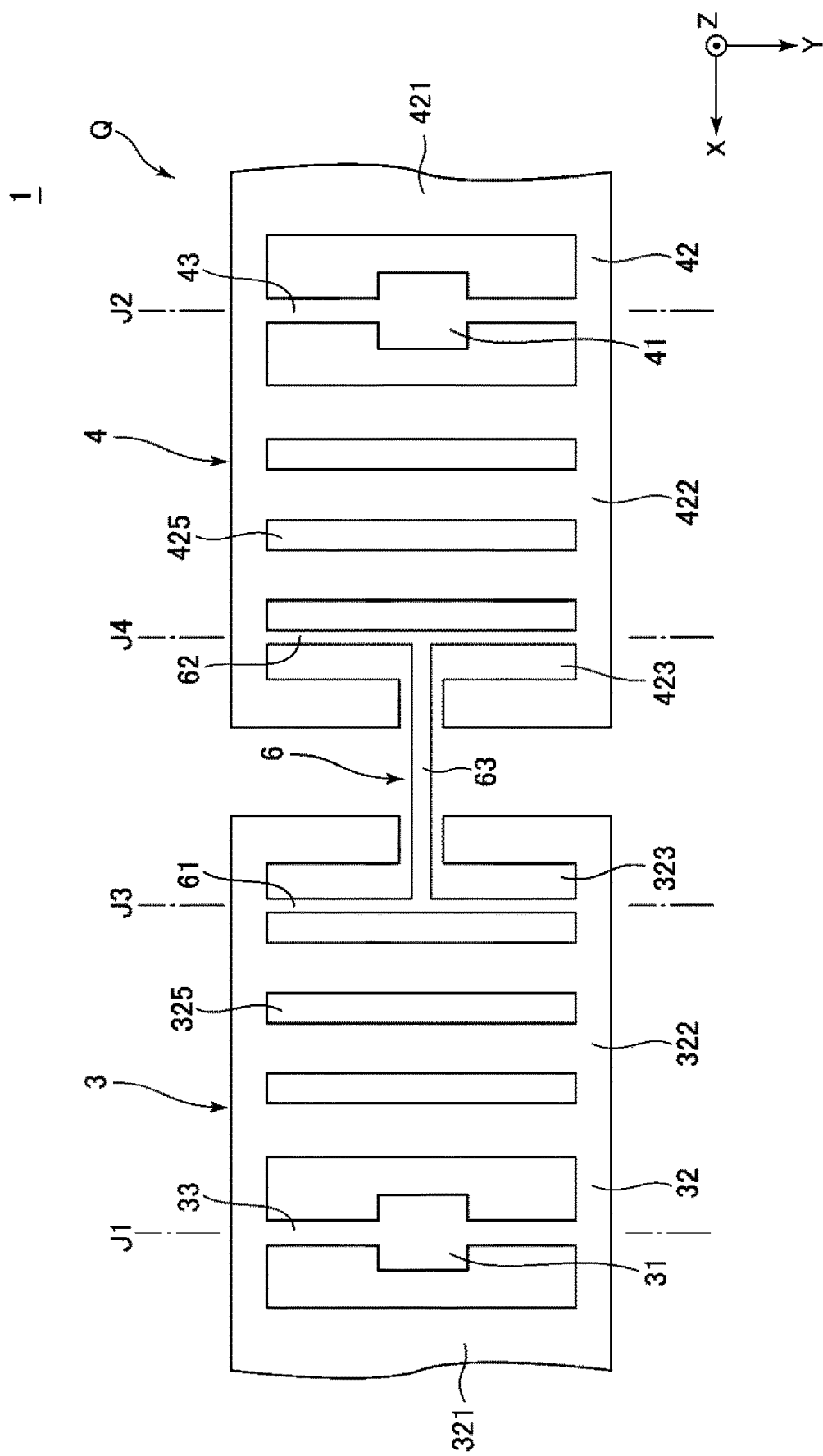
FIG. 5 is a plan view illustrating an acceleration sensor according to a second embodiment of the present disclosure.

FIG. 5 is a plan view illustrating an acceleration sensor according to a second embodiment of the present disclosure.

The second embodiment is the same as the first embodiment described above except that a coupling place between the first movable body 32 and the second movable body 42 by the coupling portion 6 is different. In the following description, the second embodiment will be described focusing on differences from the embodiment described above, and the description of the same matters will be omitted. In FIG. 5, the same configurations as those in the embodiment described above are denoted by the same reference numerals.

As illustrated in FIG. 5, the first element 3 and the second element 4 are disposed side by side in the X-axis direction orthogonal to the first and second swinging axes J1 and J2 and the second movable portion 322 of the first element 3 and the fourth movable portion 422 of the second element 4 face each other. That is, the first element 3 is disposed with the second movable portion 322 on the second element 4 side, and the second element 4 is disposed with the fourth movable portion 422 on the first element 3 side. The coupling portion 6 is positioned between the second movable portion 322 and the fourth movable portion 422, and couples the second movable portion 322 of the first movable body 32 and the fourth movable portion 422 of the second movable body 42.

As such, in the acceleration sensor 1 of the second embodiment, the coupling portion 6 couples the second movable portion 322 and the fourth movable portion 422. With this configuration, the first movable body 32 and the second movable body 42 can be easily coupled. Since the second movable portion 322 and the fourth movable portion 422 are swung in a seesaw manner in the same phase, the second movable portion 322 and the fourth movable portion 422 are coupled by the coupling portion 6, thereby capable of suppressing the deformation amount of the coupling portion 6 compared to the case where the first movable portion 321 and the fourth movable portion 422 that are swung in a seesaw manner in the opposite phases are coupled by the coupling portion 6, for example, as in the third embodiment to be described later. For that reason, breakage of the coupling portion 6 can be more effectively suppressed. The second movable portion 322 is shorter in the X-axis direction than the first movable portion 321, and the fourth movable portion 422 is shorter in the X-axis direction than the third movable portion 421. For that reason, the deformation amount of the coupling portion 6 can be suppressed as compared to the case where the first movable portion 321 and the third movable portion 421 are connected as in the first embodiment described above. For that reason breakage of the coupling portion 6 can be more effectively suppressed.

As described above, the first swinging axis J1 and the second swinging axis J2 are parallel to each other, the first movable body 32 and the second movable body 42 are disposed side by side in the X-axis direction orthogonal to the first swinging axis J1 and the second swinging axis J2 in plan view of the substrate 2, and the second movable portion 322 and the fourth movable portion 422 face each other. In other words, the second movable portion 322 and the fourth movable portion 422 are provided between the first swinging axis J1 and the second swinging axis J2. With this configuration, by disposing the coupling portion 6 between the second movable portion 322 and the fourth movable portion 422, the second movable portion 322 and the fourth movable portion 422 can be easily coupled by the coupling portion 6. The configuration of the coupling portion 6 becomes simpler, and formation of the coupling portion 6 becomes easy.

Also, by such a second embodiment, the same effect as that of the first embodiment described above can be exhibited.

Third Embodiment

Figure 6:
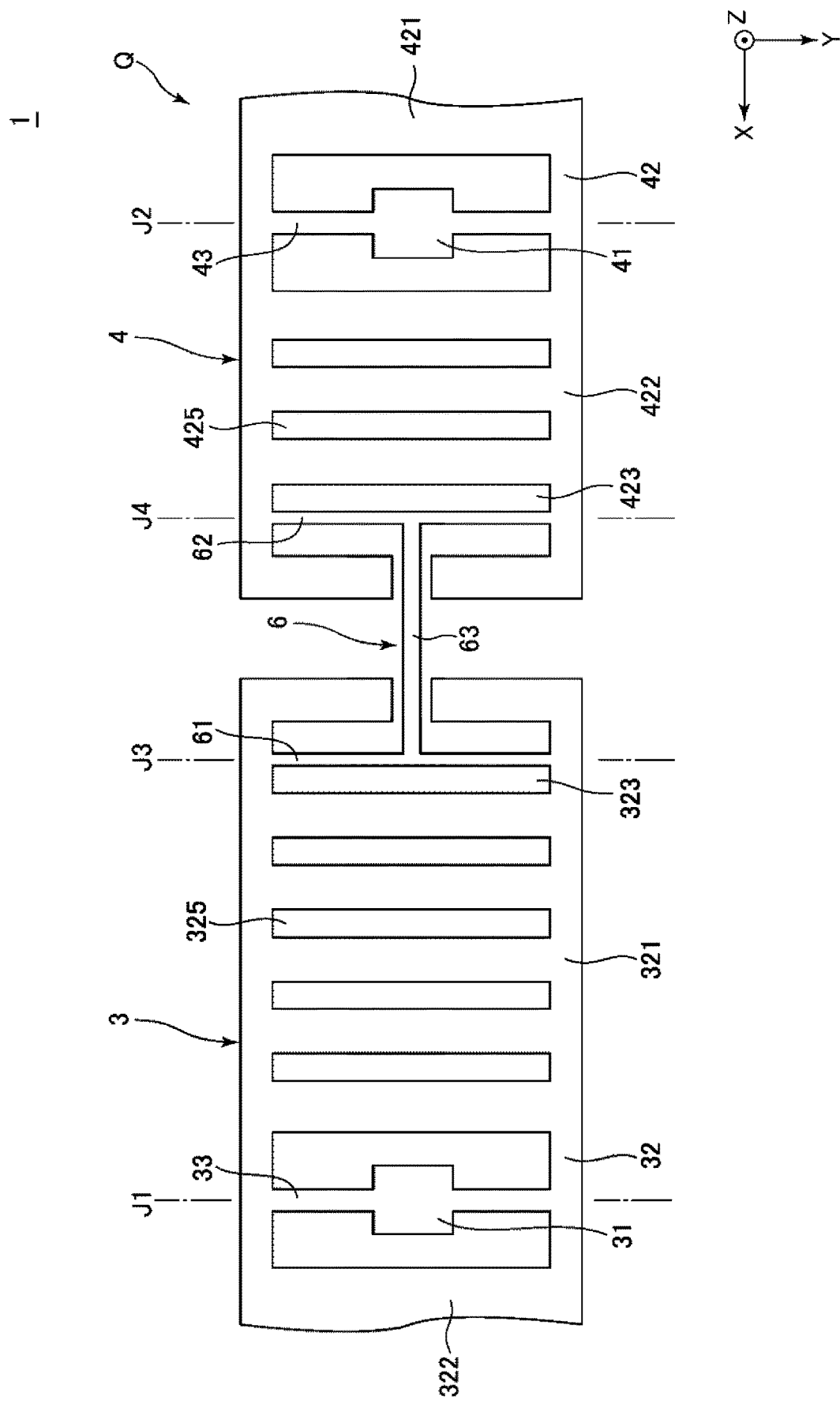
FIG. 6 is a plan view illustrating an acceleration sensor according to a third embodiment of the present disclosure.
Figure 7:
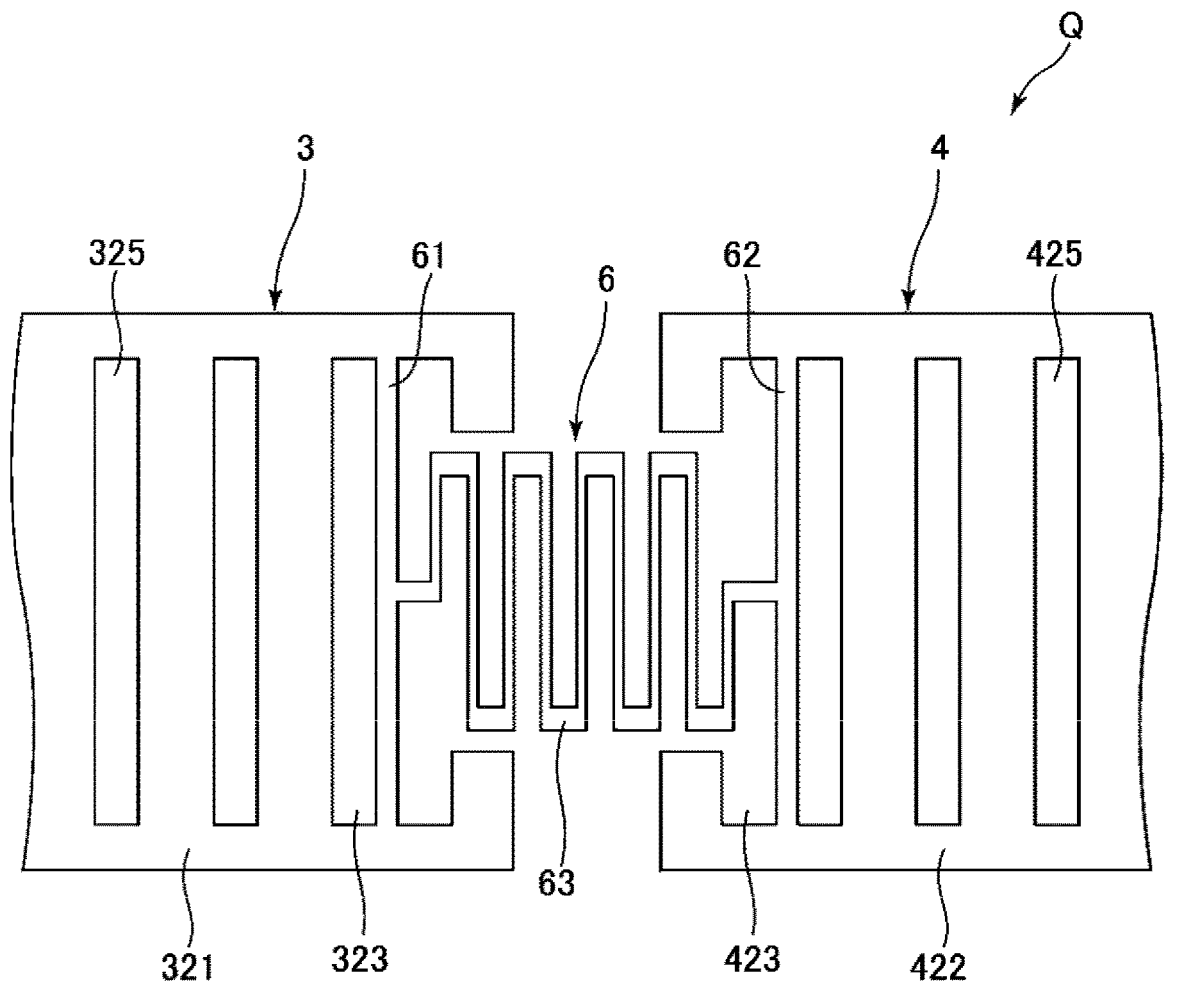
FIG. 7 is a plan view illustrating a modification example of the coupling portion illustrated in FIG. 6.

FIG. 6 is a plan view illustrating an acceleration sensor according to a third embodiment of the present disclosure. FIG. 7 is a plan view illustrating a modification example of the coupling portion illustrated in FIG. 6.

The third embodiment is the same as the first embodiment described above except that the coupling place between the first movable body 32 and the second movable body 42 by the coupling portion 6 is different. In the following description, the third embodiment will be described focusing on differences from the embodiments described above, and the description of the same matters will be omitted. In FIG. 6, the same configurations as those in the embodiments described above are denoted by the same reference numerals.

As illustrated in FIG. 6, the first element 3 and the second element 4 are disposed side by side in the X-axis direction orthogonal to the first and second swinging axes J1 and J2 and the first movable portion 321 of the first element 3 and the fourth movable portion 422 of the second element 4 face each other. That is, the first element 3 is disposed with the first movable portion 321 on the second element 4 side, and the second element 4 is disposed with the fourth movable portion 422 on the first element 3 side. The coupling portion 6 is positioned between the first movable portion 321 and the fourth movable portion 422, and couples the first movable portion 321 and the fourth movable portion 422.

As such, in the acceleration sensor 1 of the third embodiment, the coupling portion 6 couples the first movable portion 321 and the fourth movable portion 422. With this configuration, the first movable body 32 and the second movable body 42 can be easily coupled. Since the first movable portion 321 and the fourth movable portion 422 are swung in a seesaw manner in the opposite phases, the first movable portion 321 and the fourth movable portion 422 are coupled by the coupling portion 6, thereby capable of increasing the deformation amount of the coupling portion 6 compared to the case where the portions that are swung in a seesaw manner in the same phase are coupled to each other, for example, as in the first and second embodiments described above. For that reason, the force F is further increased, and sticking of the first movable body 32 and the second movable body 42 to the substrate 2 can be more effectively suppressed.

As described above, the first swinging axis J1 and the second swinging axis J2 are parallel to each other and the first movable body 32 and the second movable body 42 are disposed side by side in the X-axis direction orthogonal to the first swinging axis J1 and the second swinging axis J2 in plan view of the substrate 2, and the first movable portion 321 and the fourth movable portion 422 face each other. In other words, the first movable portion 321 and the fourth movable portion 422 are provided between the first swinging axis J1 and the second swinging axis J2. With this configuration, by disposing the coupling portion 6 between the first movable portion 321 and the fourth movable portion 422, the first movable portion 321 and the fourth movable portion 422 can be easily coupled by the coupling portion 6. The configuration of the coupling portion 6 becomes simpler, and formation of the coupling portion 6 becomes easy.

Also, with such a third embodiment, the same effects as those of the first embodiment described above can be exhibited. The shape of the connecting beam 63 is not particularly limited. For example, as illustrated in FIG. 7, the shape of the connecting beam 63 has a bellows shape, that is, a shape meandering multiple times, and may be configured to be expanded and contracted in the X-axis direction. The coupling portion 6 having such a shape has increased flexibility, is more easily deformed, and has high tolerance for displacement and deformation. With this configuration, for example, the force F can be suppressed from becoming excessively large, and seesaw swinging of the first movable body 32 and the second movable body 42 can be more reliably allowed. For example, the first and second beams 61 and 62 may be omitted from the coupling portion 6, and the first movable portion 321 and the fourth movable portion 422 may be coupled by the connecting beam 63.

Fourth Embodiment

Figure 8:
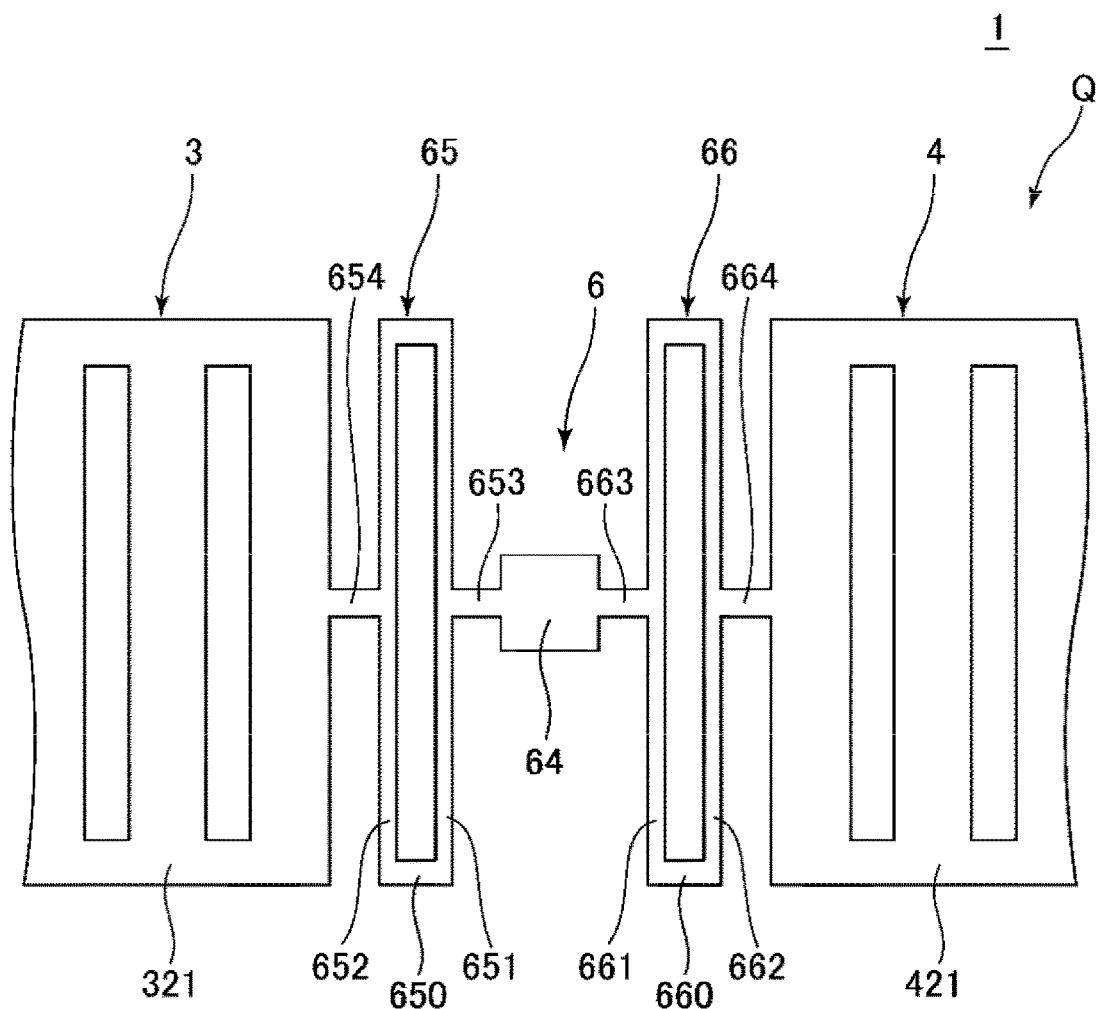
FIG. 8 is a plan view illustrating an acceleration sensor according to a fourth embodiment of the present disclosure.

FIG. 8 is a plan view illustrating an acceleration sensor according to a fourth embodiment of the present disclosure.

The fourth embodiment is the same as the first embodiment described above except that the configuration of the coupling portion 6 is different. In the following description, the fourth embodiment will be described focusing on differences from the embodiments described above, and the description of the same matters will be omitted. In FIG. 8, the same configurations as those in the embodiments described above are denoted by the same reference numerals.

As illustrated in FIG. 8, the coupling portion 6 is disposed between the first movable portion 321 and the third movable portion 421. The coupling portion 6 includes a link portion 64 fixed to the substrate 2, a first coupling beam 65 that couples the first movable body 32 and the link portion 64, and a second coupling beam 66 that couples the second movable body 42 and the link portion 64. The first coupling beam 65 includes a frame-shaped beam 650 having a pair of torsion beams 651 and 652 extending in the Y-axis direction, and a beam 653 coupling the torsion beam 651 and the link portion 64, and a beam 654 coupling the torsion beam 652 and the first movable portion 321. Similarly, the second coupling beam 66 includes a frame-like beam 660 having a pair of torsion beams 661 and 662 extending in the Y-axis direction, and a beam 663 coupling the torsion beam 661 and the link portion 64, and a beam 664 coupling the torsion beam 662 and the third movable portion 421.

With such a configuration, the pair of torsion beams 651 and 652 are deformed, thereby allowing seesaw swinging of the first movable body 32 and the pair of torsion beams 661 and 662 is deformed, thereby allowing seesaw swinging of the second movable body 42.

As such, the coupling portion 6 of the fourth embodiment includes the link portion 64 movable with respect to the substrate 2, the first coupling beam 65 coupling the first movable body 32 and the link portion 64, and the second coupling beam 66 coupling the second movable body 42 and the link portion 64. With this configuration, the configuration of the coupling portion 6 becomes simple. For example, as compared to the first embodiment described above, displacement in the Y-axis direction becomes difficult, and thus mechanical strength of the coupling portion 6 is increased.

With such a fourth embodiment, the same effects as those of the first embodiment described above can be exhibited.

Fifth Embodiment

Figure 9:
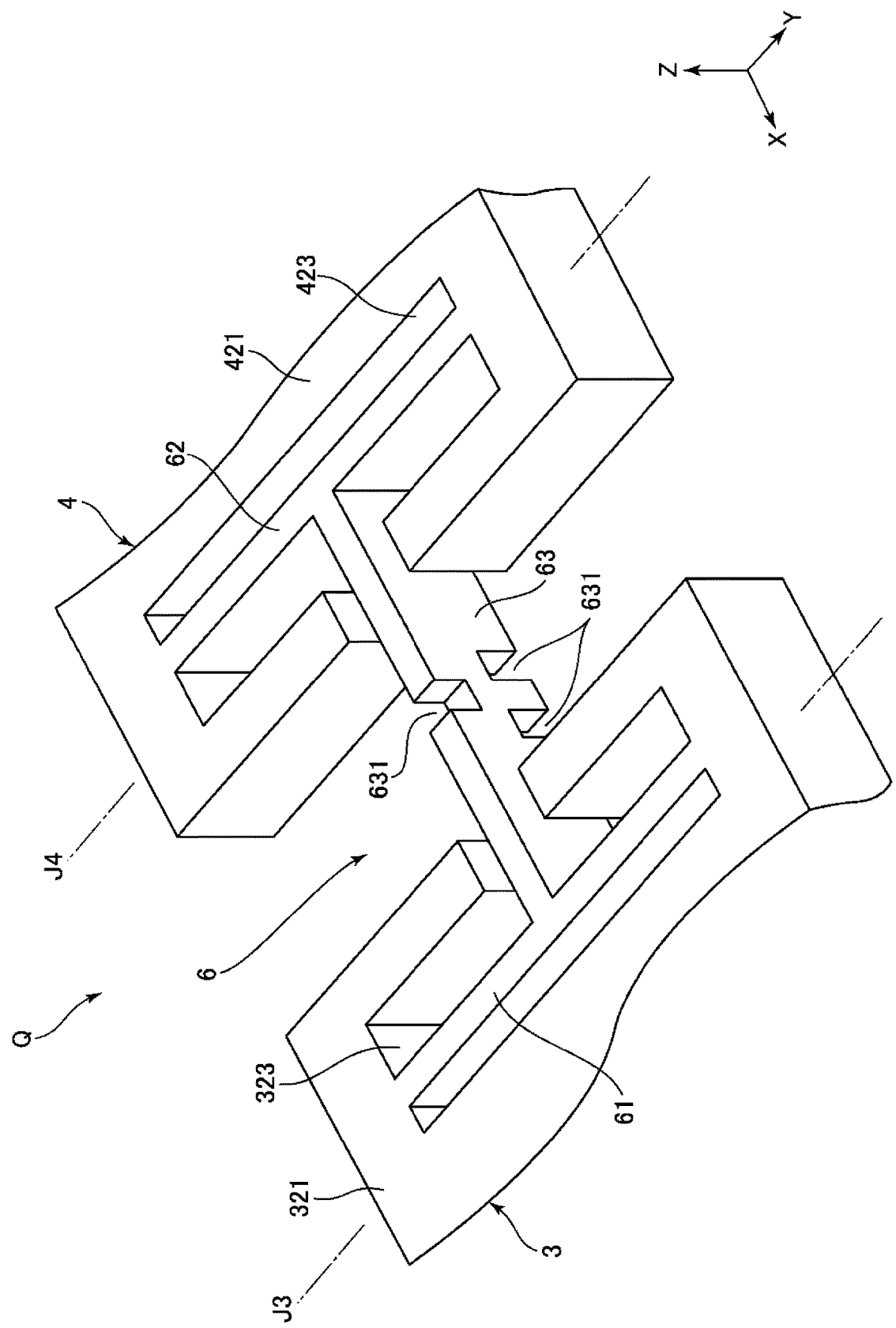
FIG. 9 is a perspective view illustrating a coupling portion included in an acceleration sensor according to a fifth embodiment of the present disclosure.

FIG. 9 is a perspective view illustrating a coupling portion included in an acceleration sensor according to a fifth embodiment of the present disclosure.

The fifth embodiment is the same as the first embodiment described above except that the configuration of the coupling portion 6 is different. In the following description, the fifth embodiment will be described focusing on differences from the embodiments described above, and the description of the same matters will be omitted. In FIG. 9, the same configurations as those in the embodiments described above are denoted by the same reference numerals.

As illustrated in FIG. 9, the coupling portion 6 is disposed between the first movable portion 321 and the third movable portion 421, and includes the first beam 61 coupled to the first movable portion 321, the second beam 62 coupled to the third movable portion 421, and the connecting beam 63 coupling the first beam 61 and the second beam 62. The connecting beam 63 is provided with a cutout 631 so that the connecting beam 63 can be easily bent with respect to the force in the Z-axis direction.

With such a configuration, not only the first beam 61 and the second beam 62 but also the connecting beam 63 has a small spring constant in the Z-axis direction. Therefore, seesaw swinging of the first movable body 32 and seesaw swinging of the second movable body 42 are further allowed.

With such a fifth embodiment, the same effects as those of the first embodiment described above can be exhibited.

Sixth Embodiment

Figure 10:
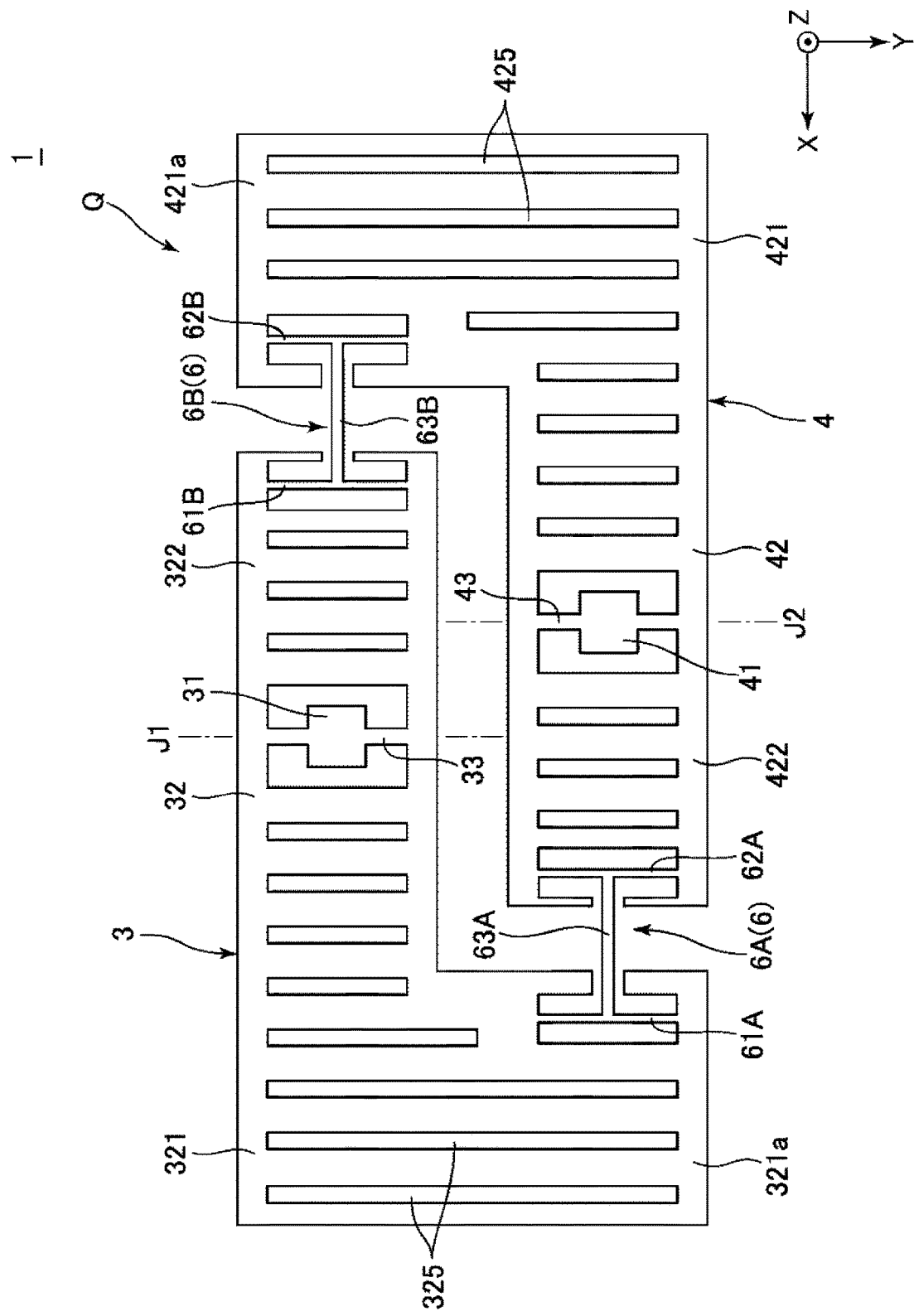
FIG. 10 is a plan view illustrating an acceleration sensor according to a sixth embodiment of the present disclosure.

FIG. 10 is a plan view illustrating an acceleration sensor according to a sixth embodiment of the present disclosure.

The sixth embodiment is the same as the first embodiment described above except that the configuration of the structural body Q is different. In the following description, the sixth embodiment will be described focusing on differences from the embodiments described above, and the description of the same matters will be omitted. In FIG. 10, the same configurations as those of the embodiment described above are denoted by the same reference numerals.

As illustrated in FIG. 10, in the first element 3, the first movable portion 321 is positioned on the plus side in the X-axis direction and the second movable portion 322 is positioned on the minus side in the X-axis direction. On the other hand, the second element 4 is disposed side by side with the first element 3 in the Y-axis direction, and is positioned on the plus side of the first element 3 in the Y-axis direction. In the second element 4, the third movable portion 421 is positioned on the minus side in the X-axis direction, and the fourth movable portion 422 is positioned on the plus side in the X-axis direction.

The first movable portion 321 includes a protruding portion 321a that protrudes from the tip end to the plus side in the Y-axis direction, and has an L shape as a whole. The protruding portion 321a is positioned side by side with the fourth movable portion 422 in the X-axis direction, and is positioned on the plus side of the fourth movable portion 422 in the X-axis direction. Similarly, the third movable portion 421 includes a protruding portion 421a that protrudes from the tip end to the minus side in the Y-axis direction, and has an L shape as a whole. The protruding portion 421a is positioned side by side with the second movable portion 322 in the X-axis direction, and is positioned on the minus side of the second movable portion 322 in the X-axis direction.

The coupling portion 6 includes a first coupling portion 6A coupling the first movable portion 321 and the fourth movable portion 422, and a second coupling portion 6B coupling the second movable portion 322 and the third movable portion 421. The first coupling portion 6A includes a first beam 61A coupled to the first movable portion 321, a second beam 62A coupled to the fourth movable portion 422, and a connecting beam 63A coupling the first beam 61A and the second beam 62A. Similarly, the second coupling portion 6B includes a first beam 61B coupled to the second movable portion 322, a second beam 62B coupled to the third movable portion 421, and a connecting beam 63B coupling the first beam 61B and the second beam 62B. The first beams 61A and 61B, the second beams 62A and 62B, and the connection beams 63A and 63B have the same configuration as the first beam 61, the second beam 62, and the connecting beam 63 described above, respectively.

As such, in the present embodiment, the coupling portion 6 includes the first coupling portion 6A coupling the first movable portion 321 and the fourth movable portion 422 and the second coupling portion 6B coupling the second movable portion 322 and the third movable portion 421. For that reason, the first movable body 32 and the second movable body 42 can be coupled to each other on both sides, and the seesaw swinging of the first movable body 32 and the second movable body 42 becomes more integrated.

According to such a sixth embodiment, the same effects as those of the first embodiment described above can be exhibited.

Seventh Embodiment

Figure 11:
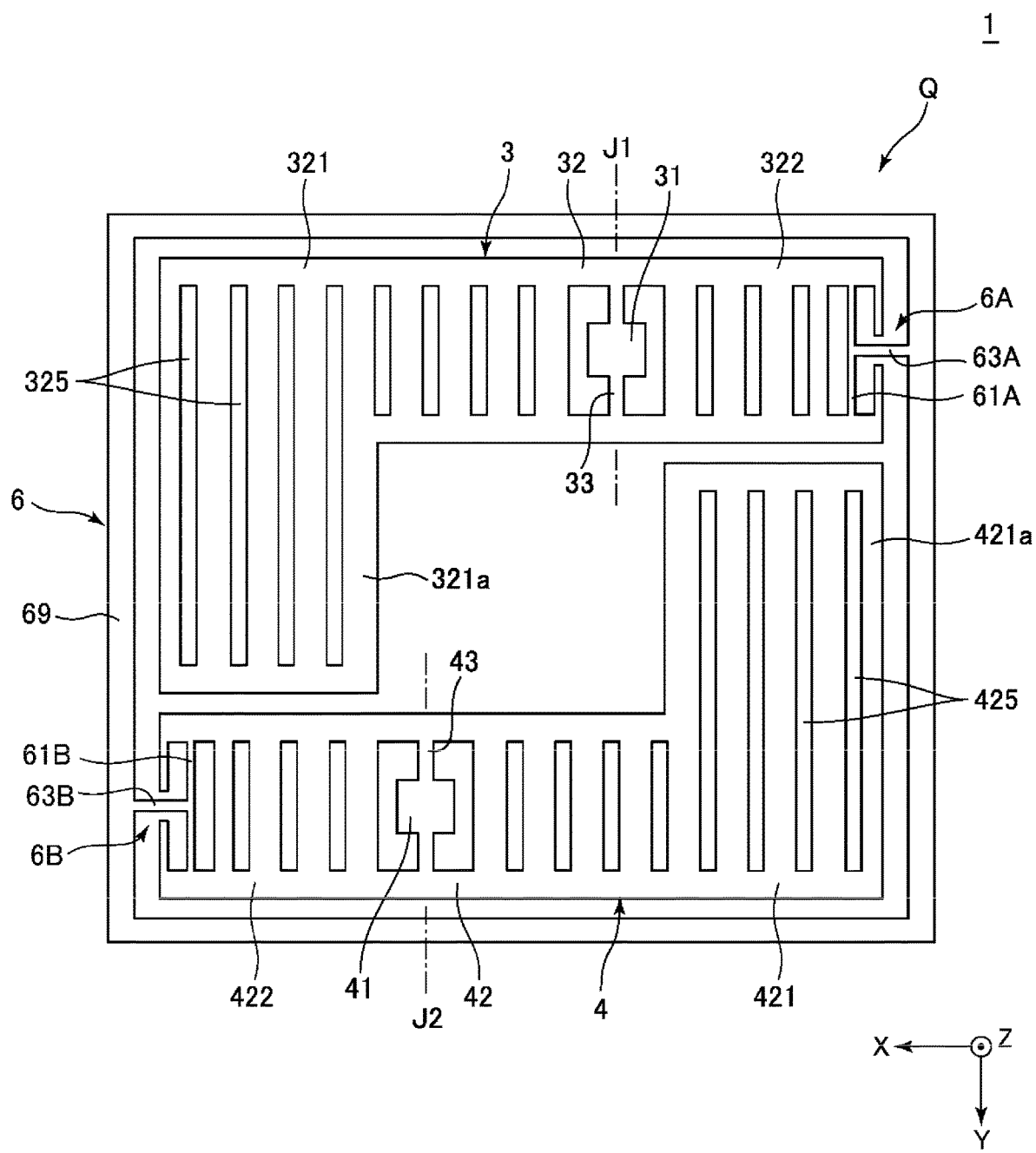
FIG. 11 is a plan view illustrating an acceleration sensor according to a seventh embodiment of the present disclosure.

FIG. 11 is a plan view illustrating an acceleration sensor according to a seventh embodiment of the present disclosure.

The seventh embodiment is the same as the first embodiment described above except that the configuration of the structural body Q is different. In the following description, the seventh embodiment will be described focusing on differences from the embodiments described above, and the description of the same matters will be omitted. In FIG. 11, the same configurations as those of the embodiments described above are denoted by the same reference numerals.

As illustrated in FIG. 11, the disposition of the first element 3 and the second element 4 is the same as that of the sixth embodiment described above. The coupling portion 6 includes a frame portion 69 having a frame shape surrounding the first element 3 and the second element 4, the first coupling portion 6A that couples the first movable portion 321 and the frame portion 69, and the second coupling portion 6B that couples the third movable portion 421 and the frame portion 69. The first coupling portion 6A includes the first beam 61A coupled to the second movable portion 322 and the connecting beam 63A coupling the first beam 61A and the frame portion 69. Similarly, the second coupling portion 6B includes the first beam 61B coupled to the fourth movable portion 422 and the connecting beam 63B coupling the first beam 61B and the frame portion 69.

With such a seventh embodiment, the same effects as those of the first embodiment described above can be exhibited.

Eighth Embodiment

Figure 12:
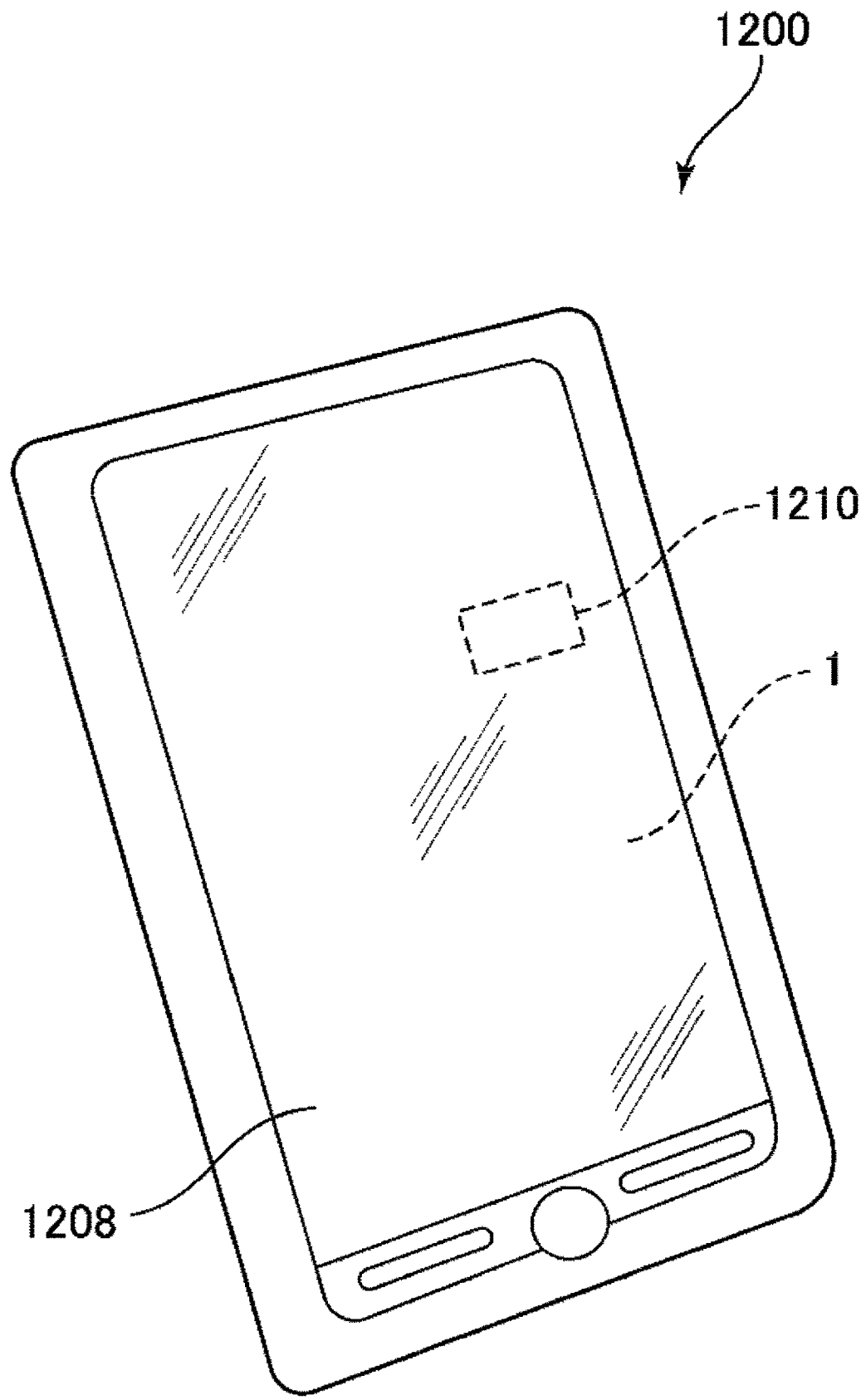
FIG. 12 is a plan view illustrating a smartphone as an electronic device according to an eighth embodiment of the present disclosure.

FIG. 12 is a plan view illustrating a smartphone as an electronic device according to an eighth embodiment of the present disclosure.

A smartphone 1200 illustrated in FIG. 12 is one to which the electronic device according to the present disclosure is applied. In the smartphone 1200, the acceleration sensor 1 and a control circuit 1210 that performs control based on detection signals output from the acceleration sensor 1 are incorporated. Detection data measured by the acceleration sensor 1 is transmitted to the control circuit 1210, and the control circuit 1210 can recognize the attitude and behavior of the smartphone 1200 from the received detection data, change a display image displayed on a display unit 1208, generate an alarm sound or sound effect, or drive the vibration motor to vibrate the main body.

The smartphone 1200 as such an electronic device includes the acceleration sensor 1. For that reason, the effects of the acceleration sensor 1 described above can be obtained, and high reliability can be exhibited.

In addition to the smartphone 1200 described above, the electronic device according to the present disclosure can be applied to, for example, a personal computer, a digital still camera, a tablet terminal, a clock, a smartwatch, an ink jet printer, a laptop personal computer, a TV, a wearable terminals such as HMD (head mounted display), a video camera, a video tape recorder, a car navigation device, a pager, an electronic datebook, an electronic dictionary, a calculator, an electronic game machines, a word processor, a work station, a videophone, a security TV monitor, an electronic binoculars, a POS terminal, medical equipment, a fish finder, various measuring instruments, mobile terminal base station equipment, various instruments of vehicles, aircraft, and ships, a flight simulator, a network server, and the like.

Ninth Embodiment

Figure 13:
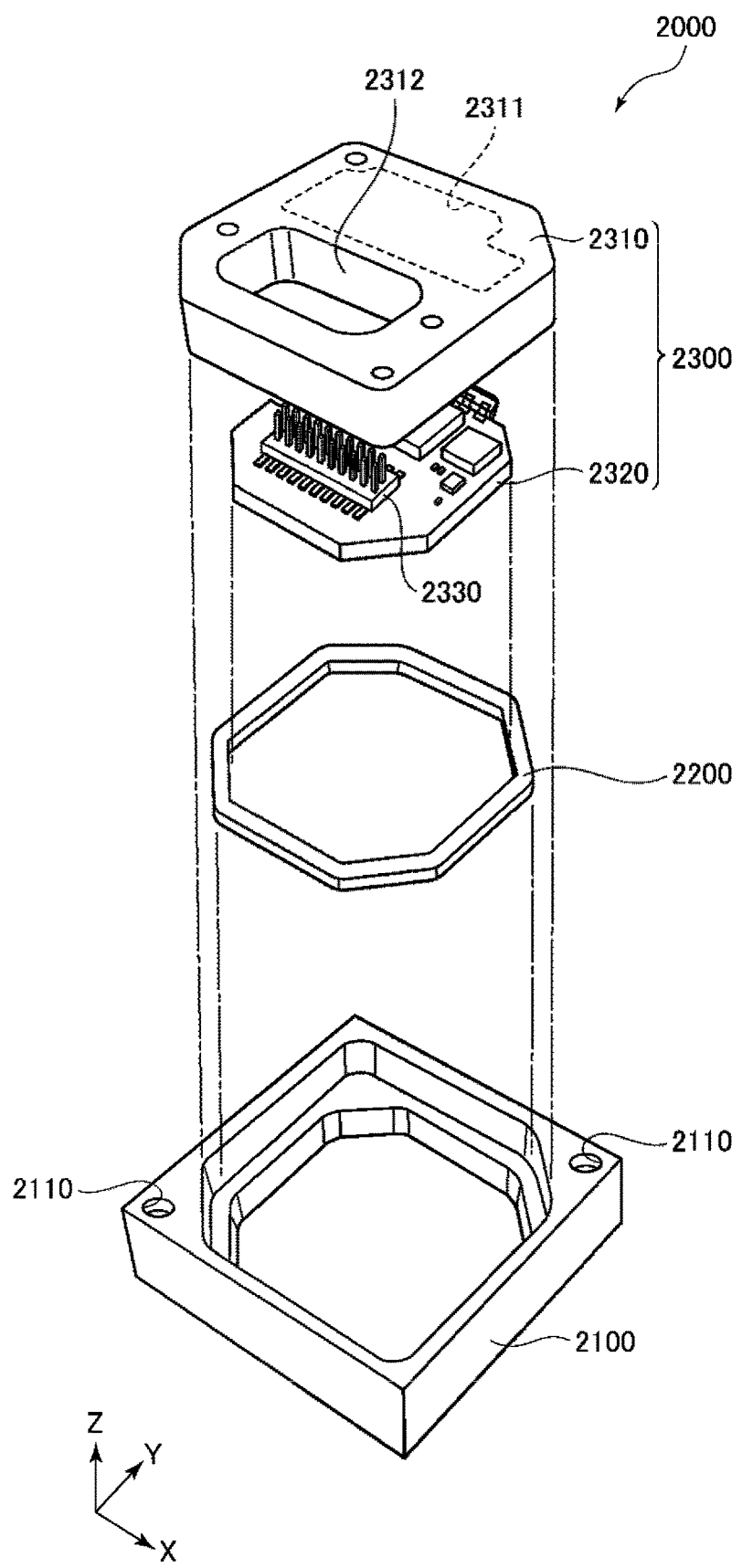
FIG. 13 is an exploded perspective view illustrating an inertial measurement device as an electronic device according to a ninth embodiment of the present disclosure.
Figure 14:
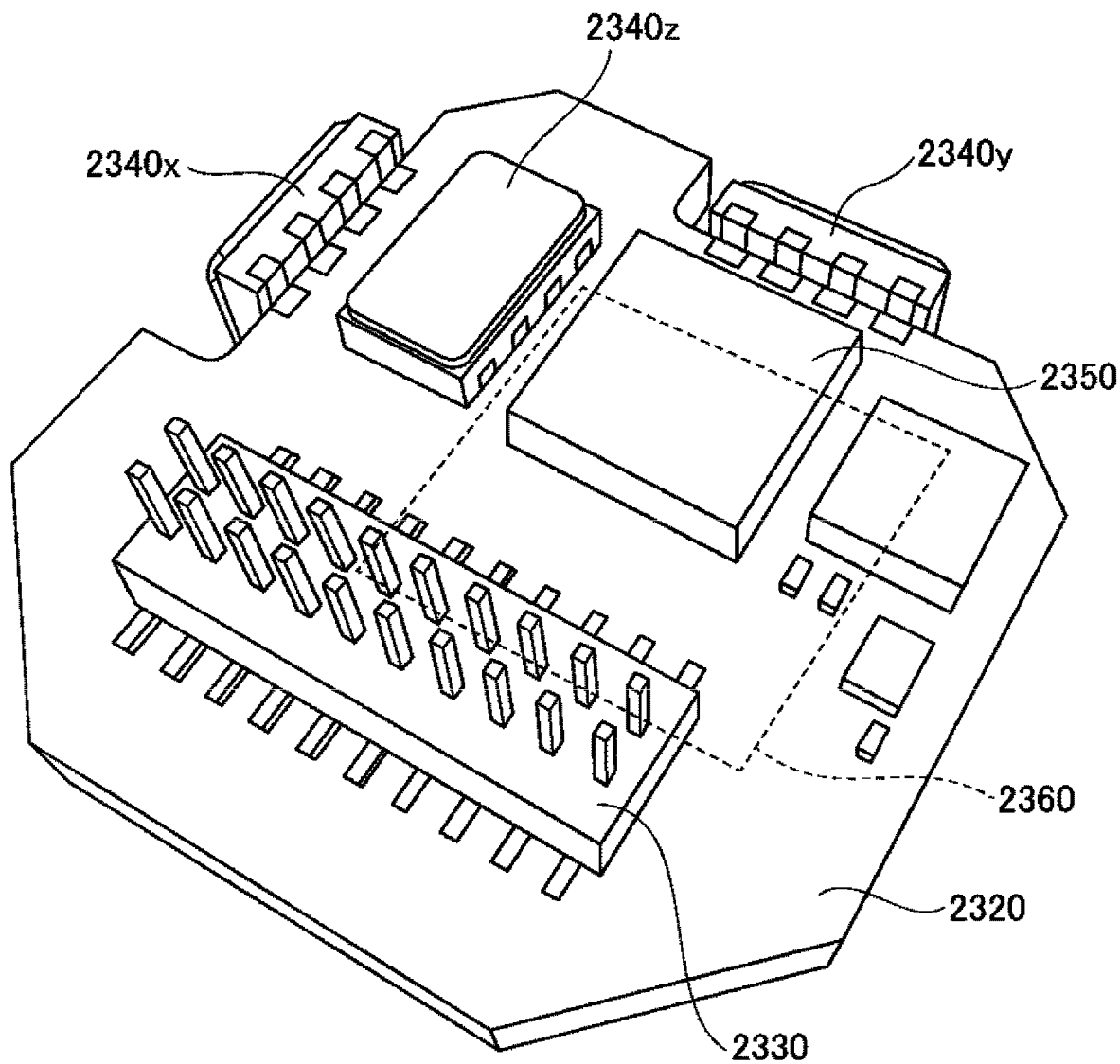
FIG. 14 is a perspective view of a substrate included in the inertial measurement device illustrated in FIG. 13.

FIG. 13 is an exploded perspective view illustrating an inertia measurement device as an electronic device according to a ninth embodiment of the present disclosure. FIG. 14 is a perspective view of a substrate included in the inertia measurement device illustrated in FIG. 13.

An inertia measurement device 2000 (IMU: Inertia measurement Unit) as the electronic device illustrated in FIG. 13 is an inertia measurement device that detects the attitude and behavior of a mounted device such as an automobile or a robot. The inertia measurement device 2000 functions as a six-axis motion sensor including three-axis acceleration sensors and three-axis angular velocity sensors.

The inertia measurement device 2000 is a rectangular parallelepiped having a substantially square planar shape. Screw holes 2110 as fixed portions are formed in the vicinity of two vertices positioned in the diagonal direction of the square. Through two screws in the two screw holes 2110, the inertia measurement device 2000 can be fixed to the mounted surface of the mounted object such as an automobile. The size of the inertia measurement device 2000 can be reduced such that the device can be mounted on a smartphone or a digital camera, for example, by selection of parts or design change.

The inertia measurement device 2000 has a configuration in which an outer case 2100, a bonding member 2200, and a sensor module 2300 are included and the sensor module 2300 is inserted in the outer case 2100 with the bonding member 2200 interposed therebetween. Similarly to the overall shape of the inertia measurement device 2000 described above, the outer shape of the outer case 2100 is a rectangular parallelepiped having a substantially square planar shape, and screw holes 2110 are formed in the vicinity of two vertices positioned in the diagonal direction of the square. In addition, the outer case 2100 has a box shape and the sensor module 2300 is accommodated therein.

Further, the sensor module 2300 includes an inner case 2310 and a substrate 2320. The inner case 2310 is a member for supporting the substrate 2320, and has a shape that fits inside the outer case 2100. A concave portion 2311 for preventing contact with the substrate 2320 and an opening 2312 for exposing a connector 2330 described later are formed in the inner case 2310. Such an inner case 2310 is bonded to the outer case 2100 via the bonding member 2200. The substrate 2320 is bonded to the lower surface of the inner case 2310 via an adhesive.

As illustrated in FIG. 14, a connector 2330, an angular velocity sensor 2340z for measuring the angular velocity around the Z-axis, an acceleration sensor 2350 for measuring acceleration in each axis direction of the X-axis, the Y-axis, and the Z-axis and the like are mounted on the upper surface of the substrate 2320. An angular velocity sensor 2340x for measuring the angular velocity around the X-axis and an angular velocity sensor 2340y for measuring the angular velocity around the Y-axis are mounted on the side surface of the substrate 2320. As the acceleration sensor 2350, the acceleration sensor according to the present disclosure can be applied.

A control IC 2360 is mounted on the lower surface of the substrate 2320. The control IC 2360 is a micro controller unit (MCU) and controls each unit of the inertia measurement device 2000. In the storing unit, programs defining the order and contents for measuring the acceleration and angular velocity, programs for digitizing detected data and incorporating the detected data into packet data, accompanying data, and the like are stored. In addition, a plurality of electronic components are mounted on the substrate 2320.

Tenth Embodiment

Figure 15:
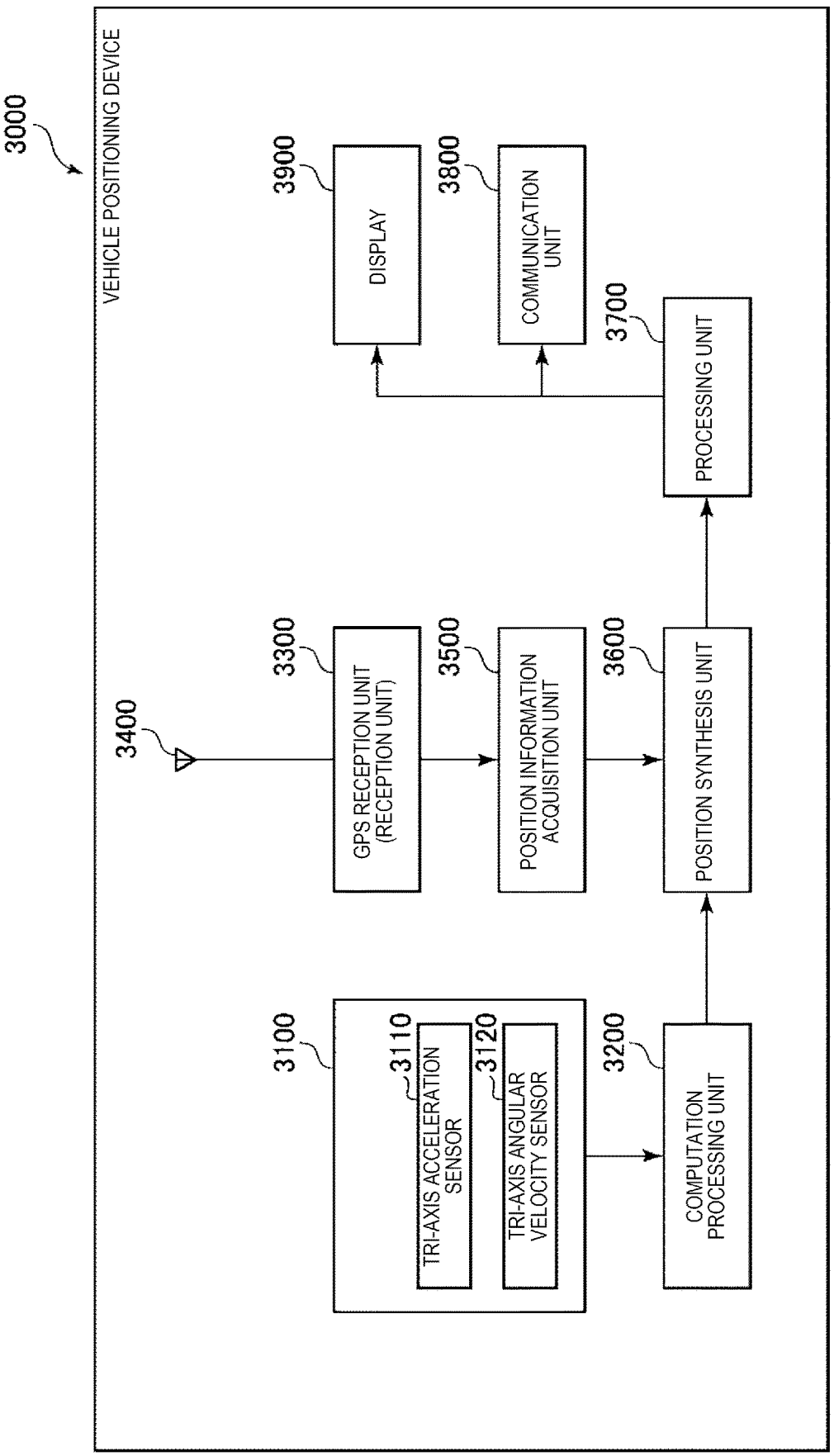
FIG. 15 is a block diagram illustrating the entire system of a vehicle positioning device as an electronic device according to a tenth embodiment of the present disclosure.
Figure 16:
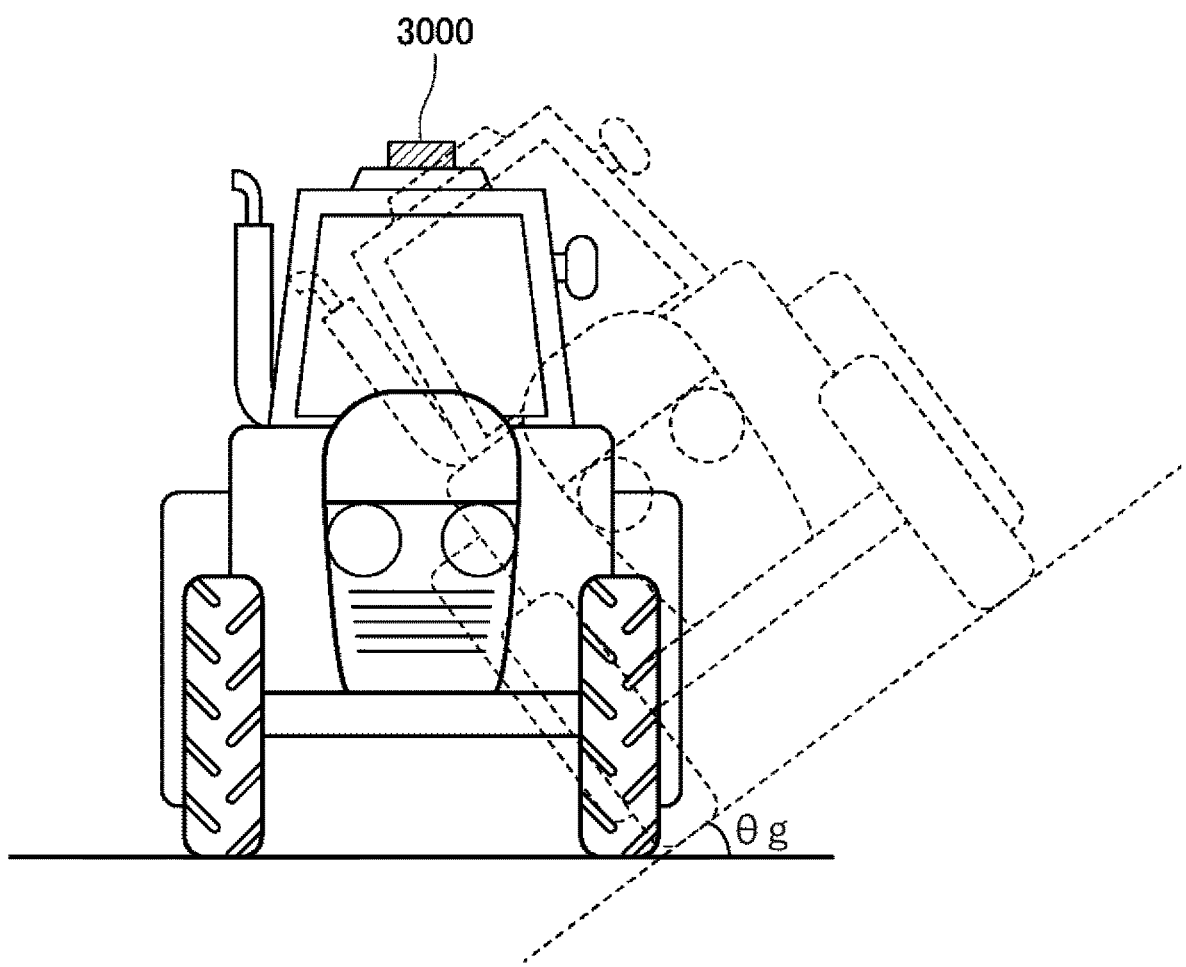
FIG. 16 is a diagram illustrating an action of the vehicle positioning device illustrated in FIG. 15.

FIG. 15 is a block diagram illustrating the entire system of a vehicle positioning device as an electronic device according to a tenth embodiment of the present disclosure. FIG. 16 is a diagram illustrating the operation of the vehicle positioning device illustrated in FIG. 15.

A vehicle positioning device 3000 illustrated in FIG. 15 is a device which is used by being mounted on a vehicle and performs positioning of the vehicle. The vehicle is not particularly limited, and may be any of a bicycle, an automobile, a motorcycle, a train, an airplane, a ship, and the like, but in the tenth embodiment, description will be made on a four-wheeled automobile as the vehicle.

The vehicle positioning device 3000 includes an inertia measurement device 3100 (IMU), a computation processing unit 3200, a GPS reception unit 3300, a receiving antenna 3400, a position information acquisition unit 3500, a position synthesis unit 3600, a processing unit 3700, a communication unit 3800, and a display 3900. As the inertia measurement device 3100, for example, the inertia measurement device 2000 described above can be used.

The inertia measurement device 3100 includes a tri-axis acceleration sensor 3110 and a tri-axis angular velocity sensor 3120. The computation processing unit 3200 receives acceleration data from the acceleration sensor 3110 and angular velocity data from the angular velocity sensor 3120, performs inertial navigation computation processing on these data, and outputs inertial navigation positioning data including acceleration and attitude of the vehicle.

The GPS reception unit 3300 receives a signal from the GPS satellite via the receiving antenna 3400. Further, the position information acquisition unit 3500 outputs GPS positioning data representing the position (latitude, longitude, altitude), speed, direction of the vehicle positioning device 3000 based on the signal received by the GPS reception unit 3300. The GPS positioning data also includes status data indicating a reception state, a reception time, and the like.

Based on inertial navigation positioning data output from the computation processing unit 3200 and the GPS positioning data output from the position information acquisition unit 3500, the position synthesis unit 3600 calculates the position of the vehicle, more specifically, the position on the ground where the vehicle is traveling. For example, even if the position of the vehicle included in the GPS positioning data is the same, as illustrated in FIG. 16, if the attitude of the vehicle is different due to the influence of inclination θ of the ground or the like, the vehicle is traveling at different positions on the ground. For that reason, it is impossible to calculate an accurate position of the vehicle with only GPS positioning data. Therefore, the position synthesis unit 3600 calculates the position on the ground where the vehicle is traveling, using inertial navigation positioning data.

The position data output from the position synthesis unit 3600 is subjected to predetermined processing by the processing unit 3700 and displayed on the display 3900 as a positioning result. Further, the position data may be transmitted to the external device by the communication unit 3800.

Eleventh Embodiment

FIG. 17 is a perspective view illustrating a vehicle according to the eleventh embodiment of the present disclosure.

An automobile 1500 illustrated in FIG. 17 is an automobile to which the vehicle according to the present disclosure in the embodiment is applied. In this figure, the automobile 1500 includes at least one system 1510 of an engine system, a brake system, and a keyless entry system. The acceleration sensor 1 is incorporated in the automobile 1500, and the attitude of the vehicle body can be measured by the acceleration sensor 1. The detection signal of the acceleration sensor 1 is supplied to the control device 1502, and the control device 1502 can control the system 1510 based on the signal.

As such, the automobile 1500 as the vehicle includes the acceleration sensor 1. For that reason, the effect of the acceleration sensor 1 described above can be obtained, and high reliability can be exhibited.

In addition, the acceleration sensor 1 can also be widely applied to a car navigation system, a car air conditioner, an anti-lock braking system (ABS), an air bag, a tire pressure monitoring system (TPMS), an engine controller, and an electronic control unit (ECU) such as a battery monitor of a hybrid car or an electric automobile. Also, the vehicle is not limited to the automobile 1500, but can also be applied to an airplane, a rocket, a satellite, a ship, an automated guided vehicle (AGV), a biped walking robot, an unmanned airplane such as a drone, and the like.

Although the acceleration sensor according to the present disclosure, the electronic device, and the vehicle of the present disclosure have been described based on the embodiments, the disclosure is not limited thereto. The configuration of each unit can be replaced with any configuration having the same function. In addition, any other constituent elements may be added to the disclosure. Further, the embodiments described above may be appropriately combined.

What is claimed is:

1. An acceleration sensor comprising:
   a substrate;
   a first movable body that includes a first movable portion and a second movable portion having a rotational moment around a first swinging axis smaller than that of the first movable portion, and swings around the first swinging axis with respect to the substrate, the first movable portion and second movable portion being disposed with the first swinging axis interposed therebetween;
   a second movable body that includes a third movable portion and a fourth movable portion having a rotational moment around a second swinging axis smaller than that of the third movable portion, and swings around the second swinging axis with respect to the substrate, the third movable portion and fourth movable portion being disposed with the second swinging axis interposed therebetween;
   a first fixed electrode that is disposed on the substrate and faces the first movable portion;

a second fixed electrode that is disposed on the substrate and faces the second movable portion;
a third fixed electrode that is disposed on the substrate and faces the third movable portion;
a fourth fixed electrode that is disposed on the substrate and faces the fourth movable portion; and
a coupling portion that directly couples the first movable body and the second movable body to each other,
wherein the coupling portion includes a first beam connected to the first movable body and torsionally deformed around an axis parallel to the first swinging axis, a second beam connected to the second movable body and torsionally deformed around an axis parallel to the second swinging axis, and a connection beam coupling the first beam and the second beam, and
wherein the connection beam linearly extends along a first direction between the first and second beams, and
wherein the first and second beams extend linearly along a second direction that is perpendicular to the first direction.

2. The acceleration sensor according to claim 1, wherein the coupling portion couples the first movable portion and the third movable portion.

3. The acceleration sensor according to claim 2, wherein the first swinging axis and the second swinging axis are parallel to each other,
the first movable body and the second movable body are disposed side by side in a direction orthogonal to the first swinging axis and the second swinging axis in plan view of the substrate, and
the first movable portion and the third movable portion are provided between the first swinging axis and the second swinging axis.

4. The acceleration sensor according to claim 1, wherein the coupling portion couples the second movable portion and the fourth movable portion.

5. The acceleration sensor according to claim 4, wherein the first swinging axis and the second swinging axis are parallel to each other,
the first movable body and the second movable body are disposed side by side in a direction orthogonal to the first swinging axis and the second swinging axis in plan view of the substrate, and
the second movable portion and the fourth movable portion are provided between the first swinging axis and the second swinging axis.

6. The acceleration sensor according to claim 1, wherein the coupling portion couples the first movable portion and the fourth movable portion.

7. The acceleration sensor according to claim 6, wherein the first swinging axis and the second swinging axis are parallel to each other,
the first movable body and the second movable body are disposed side by side in a direction orthogonal to the first swinging axis and the second swinging axis in plan view of the substrate, and
the first movable portion and the fourth movable portion are provided between the first swinging axis and the second swinging axis.

8. The acceleration sensor according to claim 1, wherein the coupling portion includes a first coupling portion that couples the first movable portion and the fourth movable portion, and a second coupling portion that couples the second movable portion and the third movable portion.

9. The acceleration sensor according to claim 1, wherein the coupling portion includes a fixed portion fixed to the substrate, the first beam coupling the first movable body and the fixed portion, and the second beam coupling the second movable body and the fixed portion.

10. The acceleration sensor according to claim 1, wherein the first movable body, the second movable body, and the coupling portion are integrally formed.

11. An electronic device comprising the acceleration sensor according to claim 1.

12. A vehicle comprising the acceleration sensor according to claim 1.

* * * * *